(12) United States Patent
Chew

(10) Patent No.: US 11,990,431 B2
(45) Date of Patent: May 21, 2024

(54) SEMICONDUCTOR STRUCTURES WITH VIA OPENINGS AND METHODS OF MAKING THE SAME

(71) Applicant: PEP INNOVATION PTE. LTD., Singapore (SG)

(72) Inventor: Hwee Seng Chew, Singapore (SG)

(73) Assignee: PEP INNOVATION PTE. LTD., Singapore (SG)

( * ) Notice: Subject to any disclaimer, the term of this patent is extended or adjusted under 35 U.S.C. 154(b) by 227 days.

(21) Appl. No.: 17/528,219

(22) Filed: Nov. 17, 2021

(65) Prior Publication Data

US 2022/0157750 A1    May 19, 2022

Related U.S. Application Data

(60) Provisional application No. 63/114,536, filed on Nov. 17, 2020.

(51) Int. Cl.
*H01L 23/00* (2006.01)

(52) U.S. Cl.
CPC .............. *H01L 24/03* (2013.01); *H01L 24/02* (2013.01); *H01L 24/94* (2013.01); *H01L 24/05* (2013.01); *H01L 2224/02206* (2013.01); *H01L 2224/0221* (2013.01); *H01L 2224/02215* (2013.01); *H01L 2224/03019* (2013.01); *H01L 2224/03614* (2013.01); *H01L 2224/03622* (2013.01); *H01L 2224/03632* (2013.01); *H01L 2224/05624* (2013.01); *H01L 2224/05647* (2013.01)

(58) Field of Classification Search
CPC .................. H01L 24/03; H01L 24/94; H01L 2224/05647
See application file for complete search history.

(56) References Cited

U.S. PATENT DOCUMENTS

| | | | |
|---|---|---|---|
| 6,232,238 B1 * | 5/2001 | Chang .................... | H01L 24/11 134/1.2 |
| 2003/0141591 A1 * | 7/2003 | Hsu ......................... | H01L 24/02 257/737 |
| 2005/0042871 A1 * | 2/2005 | Tzou ....................... | C03C 15/00 438/689 |
| 2008/0237880 A1 * | 10/2008 | Lin ......................... | H01L 23/5227 257/E21.294 |

* cited by examiner

*Primary Examiner* — Dale E Page
*Assistant Examiner* — Wilner Jean Baptiste
(74) *Attorney, Agent, or Firm* — Javalon Law, PC

(57) ABSTRACT

The present disclosure discloses a semiconductor structure having an insulating layer disposed on a wafer active surface of a semiconductor wafer for covering the wafer active surface. The insulating layer may be a protective layer in some embodiments and a cover layer in other embodiments. The insulating layer has via openings to expose contact pads for leading out electrical connections. In particular, the via openings are formed by a multi-step etching process (such as a two-step etching process) without damaging the contact pads. The two-step etching process includes a first laser etching process using normal pulse (P) and normal energy to form partial via openings in the cover layer. The second etching process includes either a laser etching process using low P and low E or a plasma etching process. The second etching process avoids damaging the contact pads.

17 Claims, 28 Drawing Sheets

SEMICONDUCTOR STRUCTURES WITH VIA OPENINGS AND METHODS OF MAKING THE SAME

CROSS-REFERENCE TO RELATED APPLICATIONS

This application claims the benefit of U.S. Provisional Application Ser. No. 63/114,536, filed on Nov. 17, 2020 and is a continuation-in-part of U.S. Non-Provisional application Ser. No. 17/376,187, filed on Jul. 15, 2021, which is also a continuation-in-part of U.S. patent application Ser. No. 15/826,268, filed on Nov. 29, 2017, and now U.S. Pat. No. 11,049,734, all of which are herein incorporated by reference for all purposes.

FIELD OF THE INVENTION

The present disclosure relates to semiconductor structures. More particularly, the present disclosure relates semiconductor structures with via openings. The present disclosure also relates to methods of making the semiconductor structures with via openings.

BACKGROUND

Semiconductor devices or dies are processed in parallel on a semiconductor wafer. After processing is completed, the wafer is singulated into individual dies. For example, a wafer singulation process, which includes sawing the wafer along the dicing or saw lines, is performed to separate the wafer into individual dies. The dies are then packaged to form packaged devices, which includes forming a redistribution layer with interconnects on a passivation layer.

An insulating layer may be provided on an active surface of the semiconductor wafer. The insulating layer is patterned to form via openings to expose contact pads (also called die pads or die bond pads) on the active surface of the wafer. However, conventional patterning techniques for forming the via openings in the insulating layer causes damage to the contact pads, affecting reliability of the contact pads for leading out functional circuits of the active surface of the wafer.

Therefore, it is desirable to form via openings in the insulating layer provided on the active surface of the wafer without damaging the contact pads.

SUMMARY

Embodiments of the present disclosure generally relate to semiconductor devices. In particular, the present disclosure relates to a semiconductor structure. The semiconductor structure includes a semiconductor wafer with a wafer active surface and a wafer inactive surface opposed to each other, wherein a plurality of contact pads are formed on the wafer active surface; an insulating layer disposed on the wafer active surface for covering the wafer active surface and the contact pads; and a plurality of via openings formed in the insulating layer for exposing the contact pads from the insulating layer without damaging the contact pads. The semiconductor structure can be further singulated into a die structure for further processing.

The present disclosure also relates to a method for making the semiconductor structure. The method includes the steps of providing a semiconductor wafer having a wafer active surface and a wafer inactive surface opposed to each other, wherein a plurality of contact pads are formed on the wafer active surface; disposing an insulating layer on the wafer active surface for covering the wafer active surface and the contact pads; and forming via openings in the insulating layer for exposing the contact pads from the insulating layer without damaging the contact pads.

The present disclosure also relates to a two-step etching process for making a die structure from a semiconductor die having a die active surface, wherein at least one via opening is formed in an insulating layer disposed on the die active surface, and a contact pad on the die active surface covered by the insulating layer is exposed from the insulating layer through the at least one via opening. The two-step etching process includes the steps of performing a first etching step for partially removing a portion of the insulating layer corresponding to the contact pad, wherein a remaining insulating layer is left in the at least one via opening; and performing a second etching step for removing the remaining insulating layer in the at least one via opening without damaging the contact pads.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

DETAILED DESCRIPTION

Embodiments generally relate to devices, for example, semiconductor devices or integrated circuits (ICs). In particular, the present disclosure relates to a wafer with an insulating layer having via openings which expose contact pads (also known as die pads or die bond pads) on the active wafer surface without damaging the contact pads. The insulating layer may be called a protective layer from FIG. 1 to FIG. 4 and FIG. 10 to FIG. 13; while called a cover layer from FIG. 5 to FIG. 9.

Figure 1:
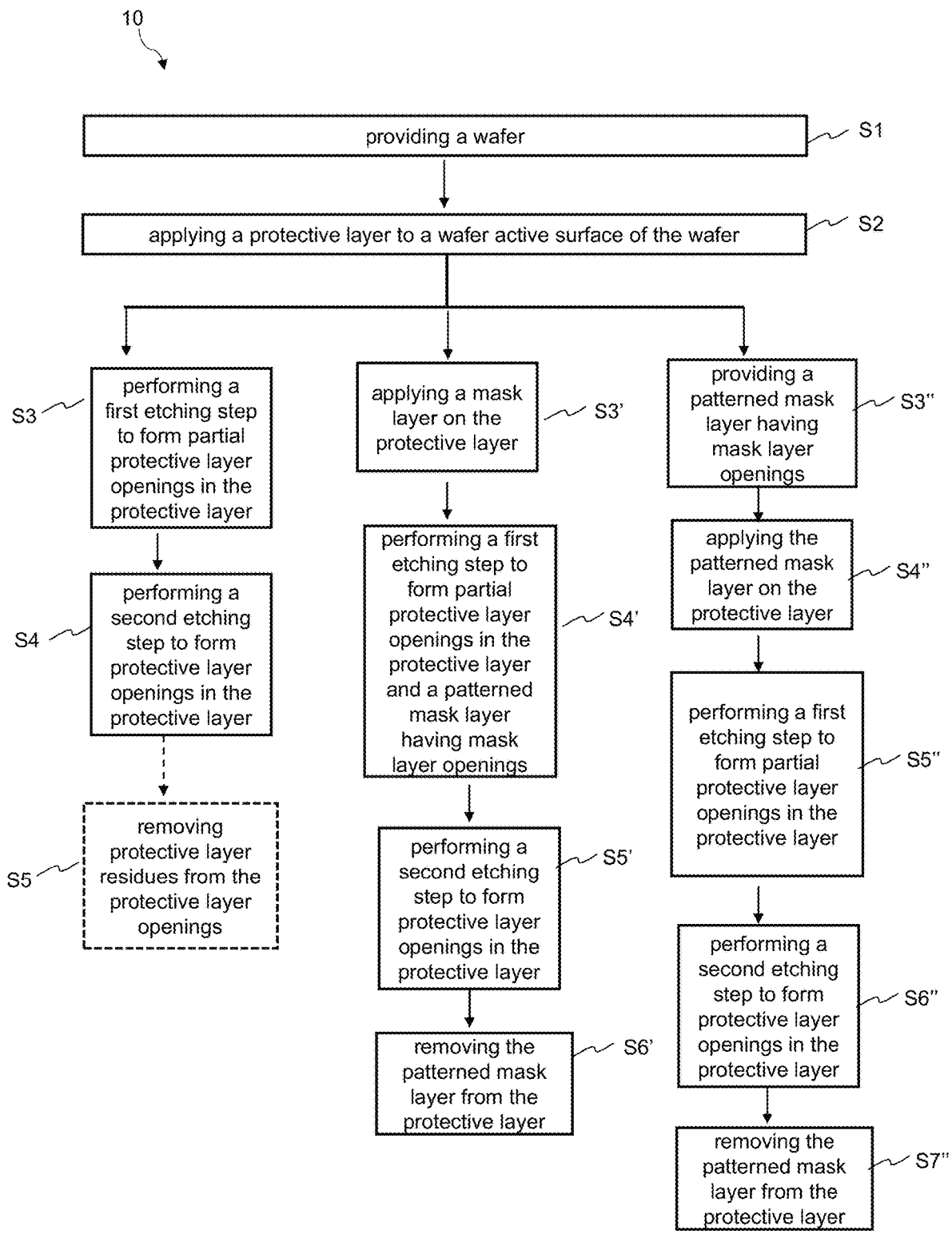
FIG. 1 illustrates a flow chart of a two-step etching process to a wafer according to an exemplary embodiment of the present disclosure.

FIG. 1 shows a flow chart of a two-step etching process 10 according to an exemplary embodiment of the present disclosure. FIG. 2 illustrates schematic diagrams of making a semiconductor structure 150 with the two-step etching process 10 by following the flow chart in FIG. 1.

Referring to FIG. 2, the two-step etching process 10 in an embodiment according to the present disclosure comprises following steps.

Step S1: providing a wafer 100.

Figure 2A:
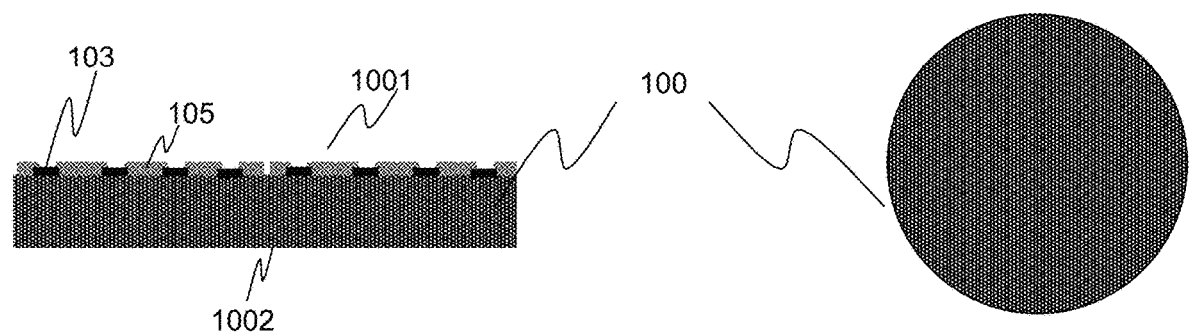
FIG. 2a-2m illustrate schematic diagrams of making a semiconductor structure using the two-step etching process in FIG. 1 according to an exemplary embodiment of the present disclosure.

As shown in FIG. 2a, the wafer 100 is provided; the wafer 100 has a wafer active surface 1001 and a wafer inactive surface (also known as wafer back surface) 1002; the wafer 100 includes a plurality of dies 113, and active surfaces of the dies 113 constitutes the wafer active surface 1001; the active surface of each die 113 in the wafer 100 forms active components and passive components by using a series of processes such as doping, deposition and etching, etc.; the active components include diodes and triodes, etc.; the passive components include voltage elements, capacitors, resistors and inductors, etc.; and these active components and passive components are connected by connection wires to form functional circuits, so as to implement various functions.

The wafer active surface 1001 further includes contact pads (also known as die pads or die bond pads) 103 connected to the active components and/or the passive components for leading out the functional circuit; and a dielectric layer 105 for protecting the contact pads 103. The contact pads 103 are usually made of metals such as Aluminum (Al), Copper (Cu), Al—Cu alloys or a combination thereof. Accordingly, the contact pads 103 are easily etched or corrupted in a traditional chemical and/or physical etching process, such as a high-power laser etching process, a radial etching process, a reactive ion etching process, a sputter etching process, an ion milling process, an ion beam assisted etching process, a reactive ion beam etching process. The dielectric layer 105 is usually made of silicon oxide ($SiO_2$) and silicon nitride ($Si_3N_4$) which is insulating to the metals of the contact pads 103.

Step S2: applying a protective layer 107 for covering the wafer active surface 1001.

Figure 2B:
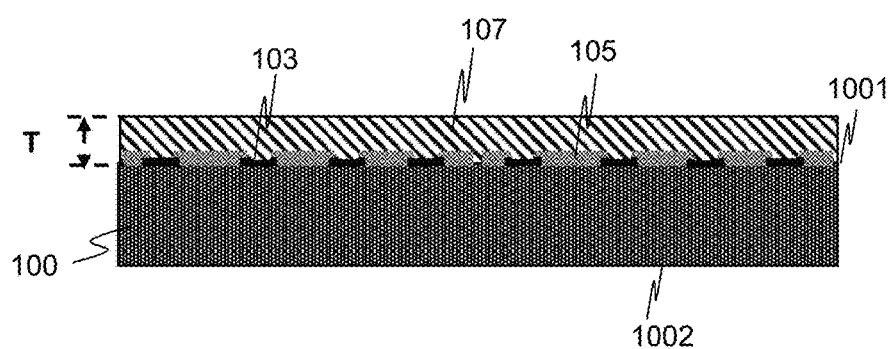

As shown in FIG. 2b, the protective layer 107 is applied to and covers the wafer active surface 1001. The protective layer 107 functions as the insulating layer to the contact pads 103 on the wafer active surface 1001 of the wafer 100. In other words, the protective layer 107 is a type of the insulating layer in accordance with the present disclosure.

The protective layer 107 may be formed on the wafer active surface 1001 of the wafer 100 by any proper methods, according to specific materials of the protective layer 107. In one embodiment, the protective layer 107 is a sheet or film material and applied to the wafer active surface 1001 by lamination, such as vacuum lamination or roller lamination. The sheet or film material is then pressed and cured against the wafer 100 for securing the protective layer 107 on the wafer active surface 1001. Alternatively, the protective layer 107 in a granule or liquid state and applied to the wafer active surface 1001 by compression mold. Alternatively, the protective layer 107 is in a liquid state and applied to the wafer active surface 1001 by spin-coating or slit die coating.

In one embodiment, the protective layer 107 is an organic/inorganic composite material layer, including an organic base (such as polyimide, epoxy, Ajinomoto buildup film (ABF)) and an inorganic fillers or filler particles. The filler particles maybe inorganic oxide particles. For example, the filler particles are $SiO_2$ particles. In one embodiment, the filler particles in the protective layer 107 are two or more different types of inorganic oxide particles, for example, $SiO_2$ particles and $TiO_2$ particles mixed with each other. Preferably, the filler particles in the protective layer 107 such as the inorganic oxide particles, e.g., $SiO_2$ particles, e.g., $SiO_2$ particles and $TiO_2$ particles mixed with each other, are spherical or spheroidal. In one embodiment, the filler particles in the protective layer 107 such as the inorganic oxide particles, e.g., $SiO_2$ particles, e.g., $SiO_2$ particles and $TiO_2$ particles mixed with each other, have a fill amount of 50% or more.

The protective layer 107 may have a flat thickness (T) across the wafer active surface 1001 of the wafer 100. In one embodiment, the flat thickness (T) of the protective layer 107 is in a range of 10-100 um, 15-100 um, 20-100 um, 25-100 um, 45-100 um or 60-100 um. In one embodiment, the flat thickness (T) of the protective layer 107 is in a range of 20-45 um. The flat thickness (T) of the protective layer 107 may have a tolerance of ±1-5 um, depending on the flat thickness (T) of the protective layer 107.

Figure 2C:
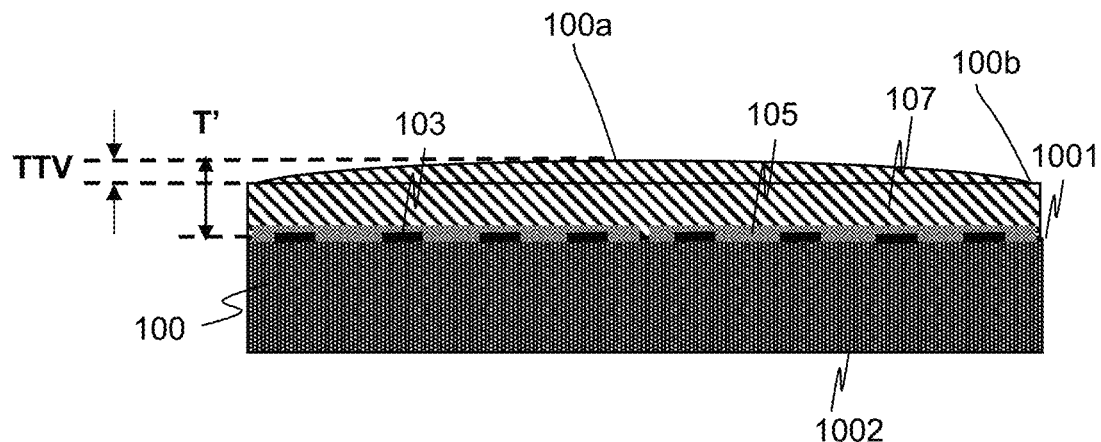

Alternatively, as shown in FIG. 2c, the protective layer 107 may have a varied thickness (T') provided on the wafer active surface 1001 if the wafer 100 has a large size, such as 6 inch, 8 inch, 12 inch or larger. The varied thickness (T') gradually tapers from a center 100a of the wafer 100 to a periphery 100b of the wafer 100. A Total Thickness Variation (TTV) may be measured to represent a difference between a maximum value of the varied thickness (T') at the center 100a of the wafer 100 and a minimum value of the varied thickness (T') at the periphery 100b of the wafer 100. In one embodiment, the Total Thickness Variation (TTV) may be in a range of 1-6 um, 2-6 um, 3-6 um, 4-6 um or 5-6 um. In one embodiment, the Total Thickness Variation (TTV) is around 2 um.

Figure 2D:
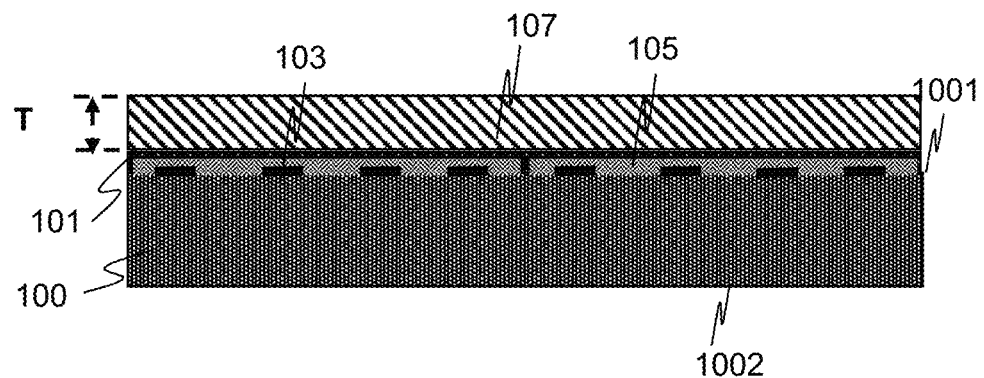

Following FIG. 2b, an adhesion promoting layer 101 may be applied between the wafer active surface 1001 of the wafer 100 and the protective layer 107 with the flat thickness (T) for enhancing adhesion of the protective layer 107 to the wafer active surface 1001, as shown in FIG. 2d. Similarly, following FIG. 2c, the adhesion promoting layer 101 may be also applied to between the wafer active surface 1001 of the wafer 100 and the protective layer 107 with the varied thickness (T'), as shown in FIG. 2e.

In some implementations, the adhesion promoting layer 101 has an organic group having an affinity with an organic substance and an inorganic group having affinity with an inorganic substance; and thus the adhesion promoting layer 101 can be bonded with the protective layer 107 by creating a bonding force between the organic group of the adhesion promoting layer 101 and the organic base of protective layer 107; and meanwhile the adhesion promoting layer 101 can be bonded with the wafer active surface 1001 by creating another bonding force between the inorganic group of the adhesion promoting layer 101 and silicon or doped silicon materials on the wafer active surface 1001. Furthermore, an additional bonding force may be also created between the inorganic group of the adhesion promoting layer 101 and the fillers or filler particles (such as $SiO_2$ particles and $TiO_2$ particles) of the protective layer 107 if the fillers or filler particles are exposed from the organic base and in direct contract with the adhesion promoting layer 101.

The adhesion promoting layer 101 is insulating to the contact pads 103 and thus will not interfere with electrical functions of the wafer 100. In one embodiment, the adhesion promoting layer 101 includes silane or its chemical derivatives, such as silane tetrahydride, binary silicon-hydrogen compounds, organosilocon compounds, including but not limited to trichlorosilane, tetramethylsilane and tetraethoxysilane. Other chemicals or compounds having such similar properties to silane or its chemical derivatives may be also appliable as the adhesion promoting layer 101 in the present disclosure. The silane or its chemical derivatives may be formed by using any proper methods, including but not limited to a spin coating process, a spray coating process, a slit die coating process or a screen printing process.

Figure 2E:
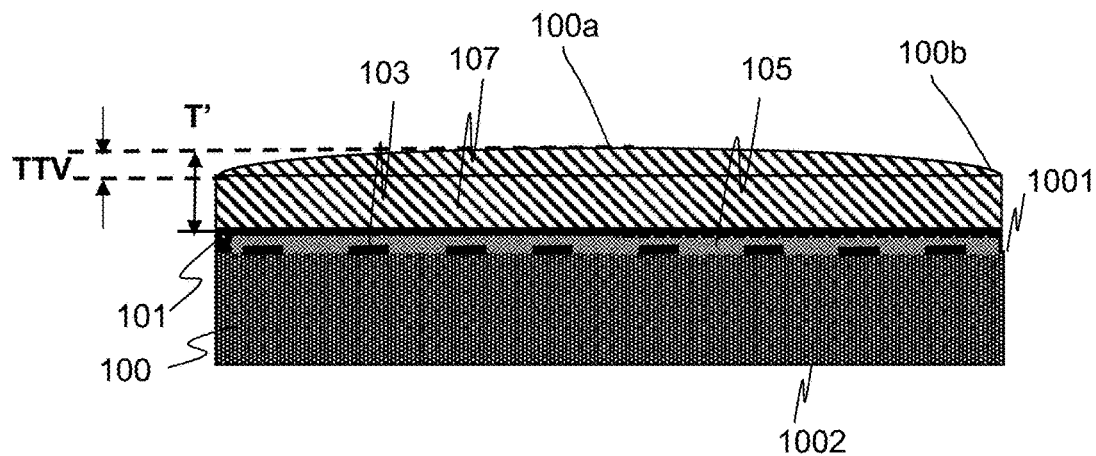

The two-step etching process 10 may also be applicable to the wafer 100 with the protective layer 107 only (shown in FIG. 2b or FIG. 2c) or the wafer 100 with both the protective layer 107 and the adhesion promoting layer 101 (shown in FIG. 2d or FIG. 2e). FIG. 2f to FIG. 2m show the two-step etching process 10 performed to the wafer 100 with the protective layer 107 only (shown in FIG. 2b or FIG. 2c) to simplify description of the two-step etching process 10. It is understood that the two-step etching process 10 of the present disclosure is also applicable to the wafer 100 with both the protective layer 107 and the adhesion promoting layer 101 (shown in FIG. 2d or FIG. 2e).

Step S3: performing a first etching step 12 to form partial protective layer openings 110 in the protective layer 107. The partial protective layer opening 110 is a type of the via opening in accordance with the present disclosure where the protective layer 107 is the type of the insulating layer.

Figure 2F:
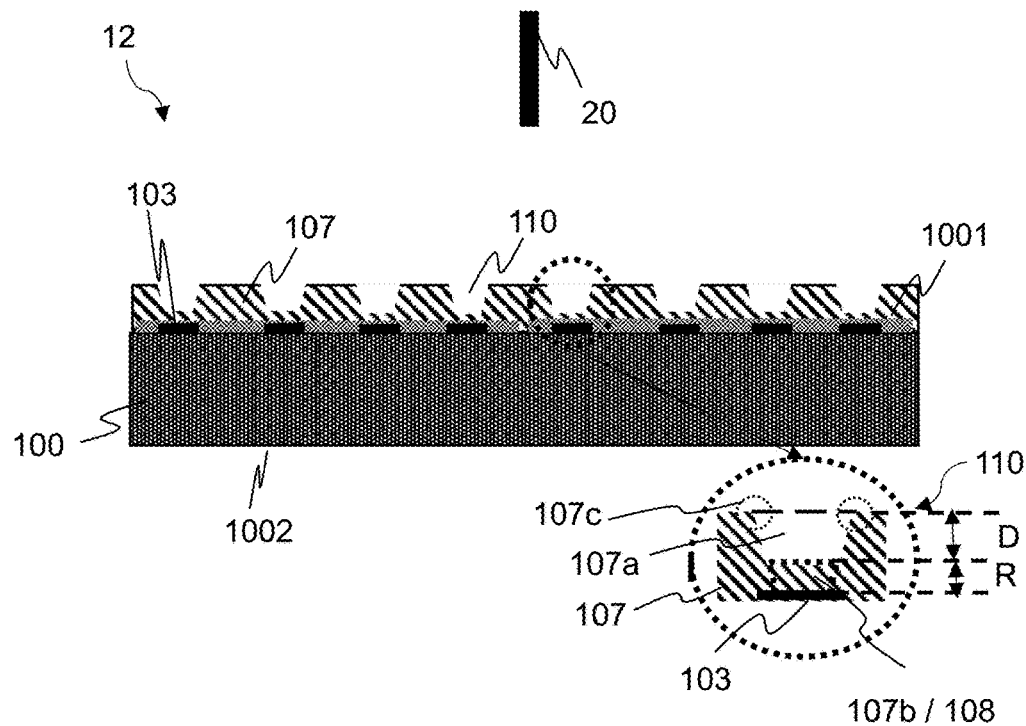

Referring FIG. 2f, the first etching step 12 is performed to the protective layer 107 as described in FIG. 2b with a first etching apparatus to remove a top portion 107a of the protective layer 107 corresponding to the contact pads 103; and thus partial protective layer openings 110 are formed in the protective layer 107. Accordingly, a bottom portion 107b of the protective layer 107 is left in the partial protective layer openings 110 and may be referred to as a remaining protective layer 108 for covering the contact pads 103, so that the contact pads 103 would not be damaged in the first etching step 12. The remaining protective layer 108 is a type of a partial insulating layer in this embodiment where the protective layer 107 is used as the insulating layer.

The partial protective layer opening 110 has a depth (D). The remaining protective layer 108 has a flat thickness (R), calculated by subtracting the depth (D) of the partial protective layer opening 110 from the thickness (T) of the protective layer 107. The remaining protective layer 108 with the flat thickness (R) will be removed in a second etching step 14 of the two-step etching process 10 described in the followings.

In one embodiment, the first etching apparatus includes a high-power laser etching device 20 with a normal energy (E) and a normal number of pulses (P). For example, the normal energy (E) of the high-power laser etching device 20 is in a range of 1-2 Joules, 1.2-2 Joules, 1.4-2 Joules, 1.6-2 Joules or 1.8-2 Joules. In one embodiment, the normal energy (E) of the high-power laser etching device 20 is in a range of 1.2-1.5 Joules.

In one embodiment, the normal number of pulses (P) of the high-power laser etching device 20 is in a range of 5-20 pulses, 7-20 pulses, 9-20 pulses, 11-20 pulses, 13-20 pulses, 15-20 pulses or 17-20 pulses. In one embodiment, the normal number of pulses (P) of the high-power laser etching device 20 is in a range of 7-10 pulses.

It is understood that the normal energy (E) and a normal number of pulses (P) of the high-power laser etching device 20 are co-related to each other in order to remove the top portion 107a of the protective layer 107. The higher the normal energy (E) is from the high-power laser etching device 20, the less the normal number of pulses (P) is needed to remove the top portion 107a of the protective layer 107. In contrast, the lower the normal energy (E) is from the high-power laser etching device 20, the more the normal number of pulses (P) is needed to remove the top portion 107a of the protective layer 107. It is also understood that the normal energy (E) and the normal number of pulses (P) of the high-power laser etching device 20 are chosen according to specific materials of the protective layer 107. To remove a certain thickness of the protective layer 107, in some implementations, the normal energy (E) and the normal number of pulses (P) may have a linear relationship; while in other implementations, the normal energy (E) and the normal number of pulses (P) may have a non-linear relationship. For example, if the protective layer 107 is formed with Ajinomoto buildup film (ABF), the high-power laser etching device 20 can remove a thickness of 2 um with one pulse if the normal energy (E) is set at 1.2 Joules; while high-power laser etching device 20 can remove a thickness of 2.8 um with one pulse if the normal energy (E) is set at 2 Joules.

Accordingly, the remaining protective layer 108 is left in the partial protective layer openings 110. The first etching step 12 is performed in a uniform manner such that the thickness (R) of the remaining protective layer 108 is substantially flat across the wafer active surface 1001 of the wafer 100. The flat thickness (R) of the remaining protective layer 108 is in a range of 1-8 um, 2-8 um, 3-8 um, 4-8 um, 5-8 um, 6-8 um or 7-8 um. In one embodiment, the flat thickness (R) of the remaining protective layer 108 is around 2 um.

Similarly, the first etching step 12 described above can be performed to the protective layer 107 and the adhesion promoting layer 101 in FIG. 2d to form the partial protective layer openings 110. Accordingly, the contact pads 103 are covered by the adhesion promoting layer 101 and the remaining protective layer 108.

Figure 2G:
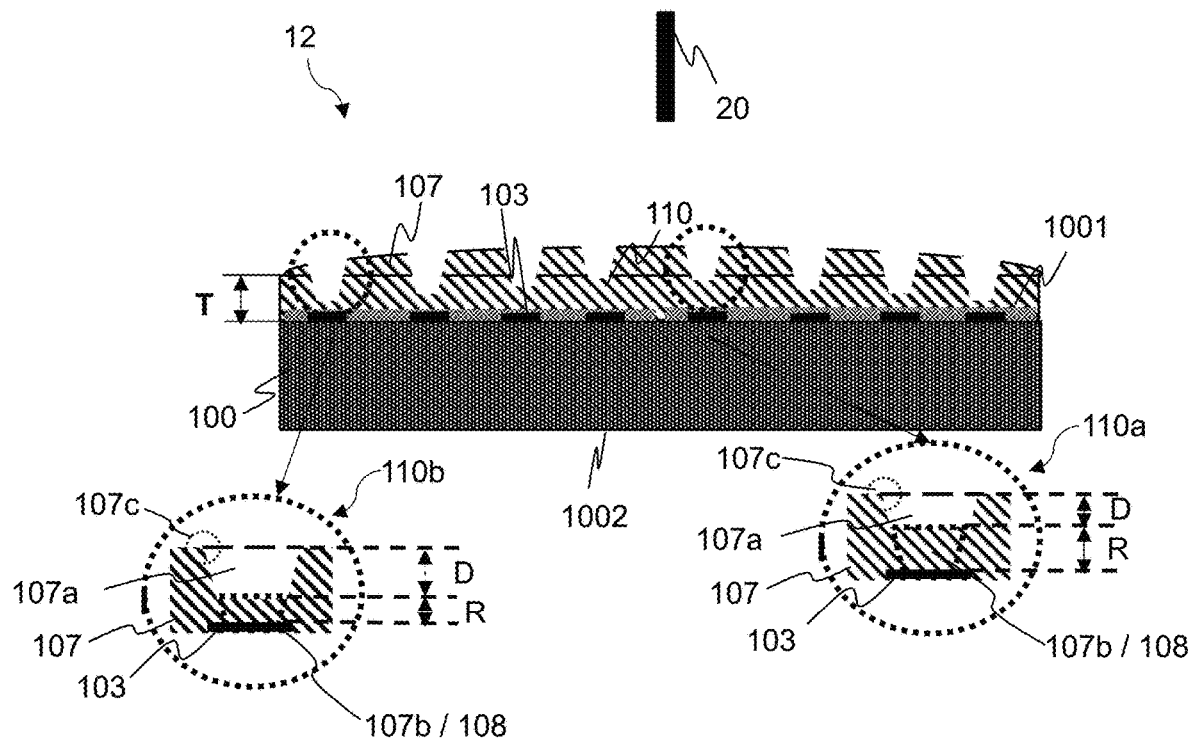

Referring FIG. 2g, the first etching step 12 as described above can be performed to the protective layer 107 having the varied thickness (T'), as described in FIG. 2c to form the partial protective layer openings 110, using the first etching apparatus (such as the high-power laser etching device 20).

While the first etching step 12 is still performed in a uniform manner, the remaining protective layer 108 also has a varied thickness (R') according to the Total Thickness Variation (TTV) in FIG. 2c. In other words, the varied thickness (R') of the remaining protective layer 108 gradually tapers from the center 100a of the wafer 100 to the periphery 100b of the wafer 100, if the first etching step 12 is performed uniformly across the wafer active surface 1001 of the wafer 100. For example, the remaining protective layer 108 in a partial protective layer openings 110a at the center 100a of the wafer 100 is larger by the Total Thickness Variation (TTV) than in another partial protective layer openings 110b at the periphery 100b of the wafer 100.

Similarly, the first etching step 12 described above can be performed to the protective layer 107 with the adhesion promoting layer 101 in FIG. 2e to form the partial protective layer openings 110. Accordingly, the contact pads 103 are covered by the adhesion promoting layer 101 and the remaining protective layer 108; and the remaining protective layer 108 has a varied thickness (R') according to the Total Thickness Variation (TTV) in FIG. 2c.

The laser emitted from the high-power laser etching device 20 has superior directivity; and thus removes the top portion 107a of the protective layer 107 corresponding to the contact pads 103 only, in order to not etch away the protective layer 107 outside the partial protective layer openings 110. As shown in FIG. 2f and FIG. 2g, the protective layer 107 has sharp edges 107c at intersections of the protective layer 107 and the partial protective layer openings 110.

The high-power laser etching device 20 may perform the first etching step 12 in a fast manner in order to save processing time and thus to enhance productivity of the two-step etching process 10 in the present disclosure.

The partial protective layer opening 110 may have any shape according to specific designs of the semiconductor structure 150. In one embodiment, the partial protective layer opening 110 has a circular or round shape for easy operation of the first etching step 12. The partial protective layer opening 110 may have any size according to specific designs of the semiconductor structure 150. However, the size shall not be too small for filling conductive materials in a following step (not shown) after the two-step etching process 10.

Step S4: performing the second etching step 14 to form protective layer openings 109 in the protective layer 107. The protective layer opening 109 is a type of via opening in this embodiment of the present disclosure, where the protective layer 107 is the type of the insulating layer as described above.

The second etching step 14 is performed to the protective layer 107 as described in FIG. 2f, with a second etching apparatus to remove the bottom portion 107b of the protective layer 107, i.e. the remaining protective layer 108 exposed from the partial protective layer openings 110. Accordingly, the protective layer openings 109 are formed in the protective layer 107.

Figure 2H:
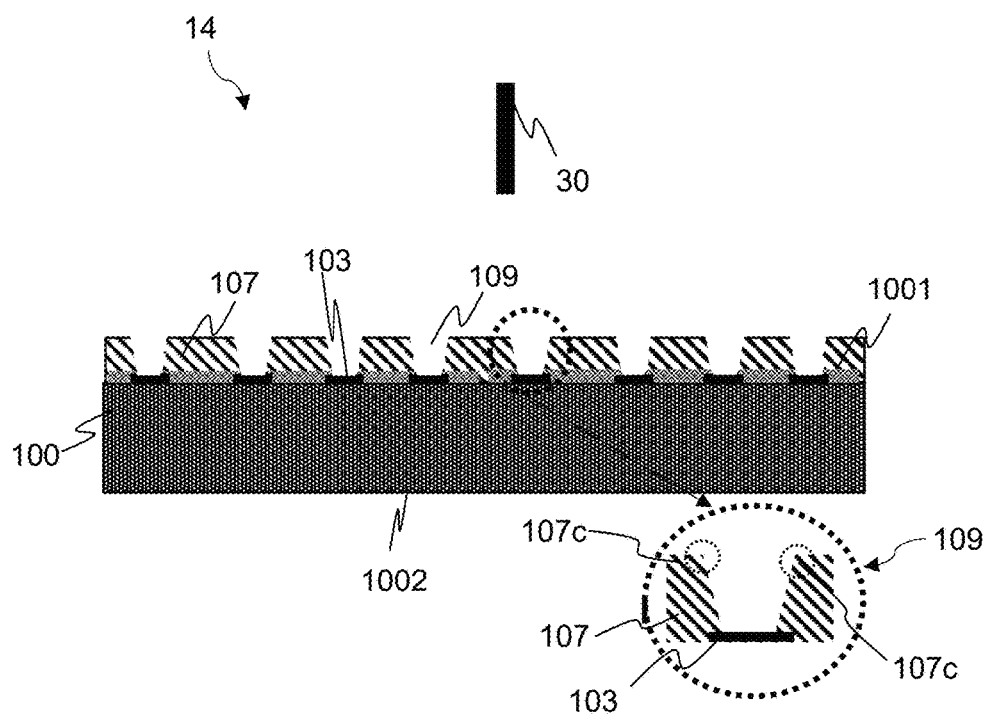

Referring to FIG. 2h, in one embodiment, the second etching apparatus includes a low-power laser etching device 30 with a low energy (E) and a small number of pulses (P). For example, the low energy (E) of the low-power laser etching device 30 is in a range of 0.3-0.6 Joule, 0.4-0.6 Joules or 0.3-0.5 Joule. In one embodiment, the low energy (E) of the low-power laser etching device 30 is in a range of 0.3-0.4 Joule. In another preferred embodiment, the low energy (E) of the low-power laser etching device 30 is in a range of 0.5-0.6 Joule.

In one embodiment, the small number of pulses (P) from the low-power laser etching device 30 is determined by the flat thickness (R) and the specific material of the remaining protective layer 108. For example, if the protective layer 107 is formed with Ajinomoto buildup film (ABF), the low-power laser etching device 30 can remove a thickness of 1 um with one pulse if the low energy (E) is set at 0.3-0.4 Joule; while low-power laser etching device 30 can remove a thickness of 1.3 um with one pulse if the low energy (E) is set at 0.5-0.6 Joule.

It is understood that the higher the low energy (E) is for the low-power laser etching device 30, the less the number of pulses (P) is needed to remove the bottom portion 107b of the protective layer 107, and the faster the second etching step 14 would be in order to save processing time and thus to enhance productivity. However, the low energy (E) of the low-power laser etching device 30 should not be too high to damage the contact pads 103.

The high-power laser etching device 20 and the low-power laser etching device 30 may use a pulsed ultra-violet (UV) laser with a same wavelength for performing the first etching step 12 and the second etching step 14, respectively. For example, the pulsed ultra-violet (UV) laser utilizes an Excimer laser which uses a compound of Nobel gases, halogen etc. as its laser medium, such as ArF Excimer laser having a wavelength of 193 nm, KrF Excimer laser having a wavelength of 248 nm, XeCl Excimer laser having a wavelength of 308 nm or XeF Excimer laser having a wavelength of 351 nm. In one embodiment, the Excimer laser has a wavelength of 355 nm for performing the two-step etching process 10, i.e. forming the partial protective layer opening 110 in the first etching step 12 and the protective layer opening 109 in the second etching step 14.

Similar to the high-power laser etching device 20, laser emitted from the low-power laser etching device 30 may also have the superior directivity; and thus the sharp edges 107c are reserved in the second etching step 14 in FIG. 2h. The sharp edges 107c can advantageously meet production specifications of electronic products produced with the two-step etching process 10.

Step S5: removing protective layer residues 112 from the protective layer opening 109. The Step S5 is represented in a dash square in FIG. 1 to show that the Step S5 is an additional process not necessary for the two-step etching process 10.

Figure 2I:
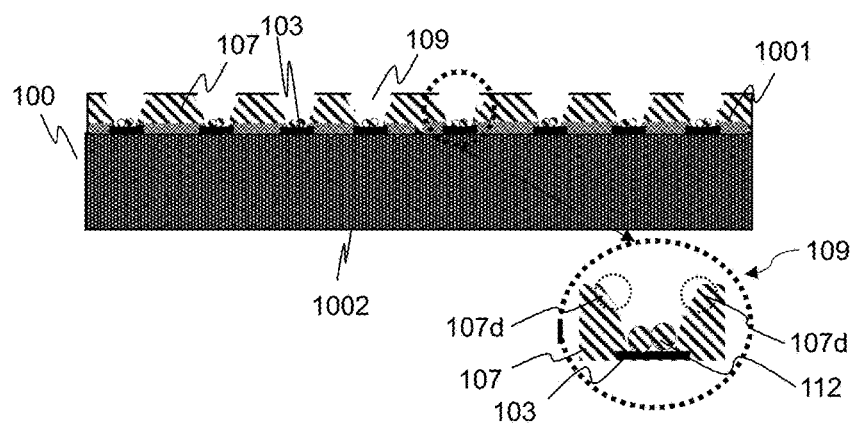

Referring to FIG. 2i, the protective layer 107 may not be completely removed from the protective layer openings 109; and some materials of the protective layer 107 left in the protective layer openings 109 are called the protective layer residues 112. The additional process is needed to completely remove the protective layer residue 112 from the protective layer openings 109 for fully exposing the contact pads 103 from the protective layer 107.

The additional process is performed by etching technologies having a slow etching rate for protecting the contact pads 103 from being damaged. In one embodiment, plasma etching is adopted in the additional process for removing the protective layer residues 112, including but not limited to carbon tetrafluoride ($CF_4$) gas plasma etching, sulfur tetrafluoride ($SF_4$) gas plasma etching, oxygen ($O_2$) gas plasma etching, Argon gas (Ar) plasma etching, or a combination thereof.

In contrast to the laser emitted from the high-power laser etching device 20 or the low-power laser etching device 30, the plasma etching does not have the superior directivity and thus would also etch the sharp edges 107c away and form etched edges 107d.

Figure 2J:
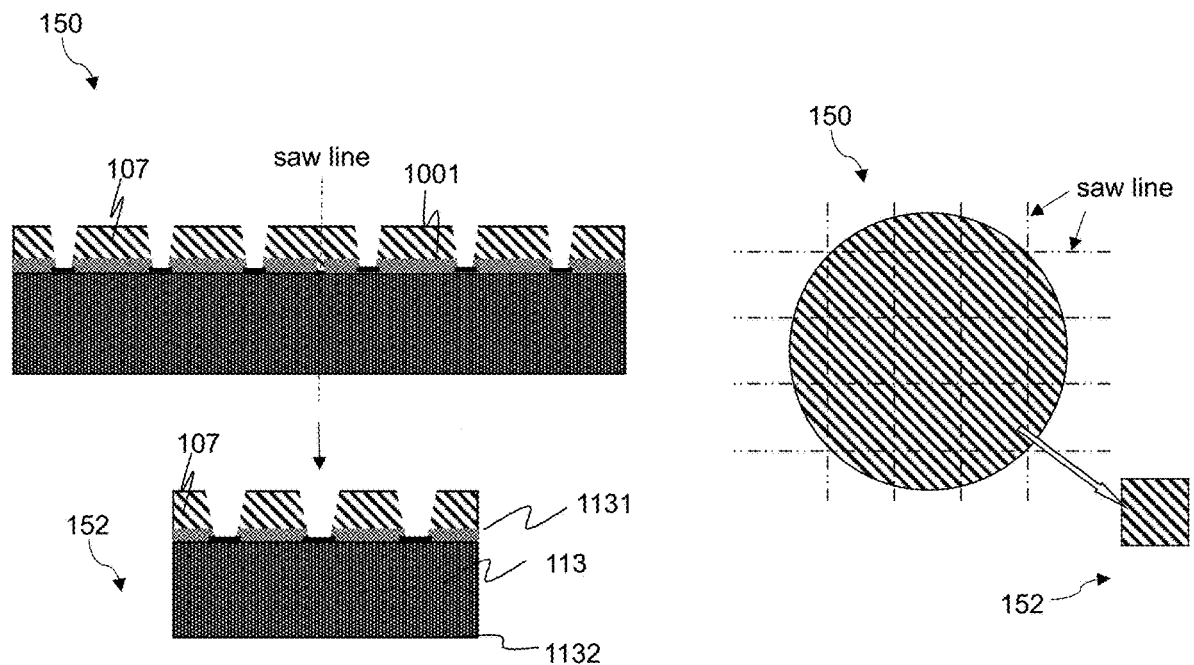

Referring to FIG. 2j, the semiconductor structure 150 is formed including the wafer 100 and the protective layer 107 with the protective layer openings 109. The semiconductor structure 150 is cut along a cutting line, to obtain a plurality of die structures 152. The die structure 152 has the die 113 with a die active surface 1131 and a die back surface 1132, and the protective layer 107 formed on the die active surface 1131 of the die 113 with the protective layer openings 109. As shown in FIG. 2j, if no protective layer residues 112 is left after the second etching step 14 by the low-power laser etching device 30, the sharp edges 107c are reserved for the dies 113. In contrast, if the additional process in FIG. 2i is performed to remove the protective layer residues 112, the semiconductor structure 150 would have etched edges 107d in the protective layer 107 (not shown).

It is understood that the second etching step 14 (including the additional process in FIG. 2i) can be applicable to the partial protective layer openings 110 in FIG. 2g by using the low-power laser etching device 30 as described above. Since the remaining protective layer 108 is completely removed from the partial protective layer openings 110, a similar semiconductor structure (not shown) to the semiconductor structure 150 can be also obtained, but having the protective layer 107 with the TTV. Of course, the TTV of the protective layer 107 may be further removed, and the similar semiconductor is processed to the semiconductor structure 150.

Figure 2K:
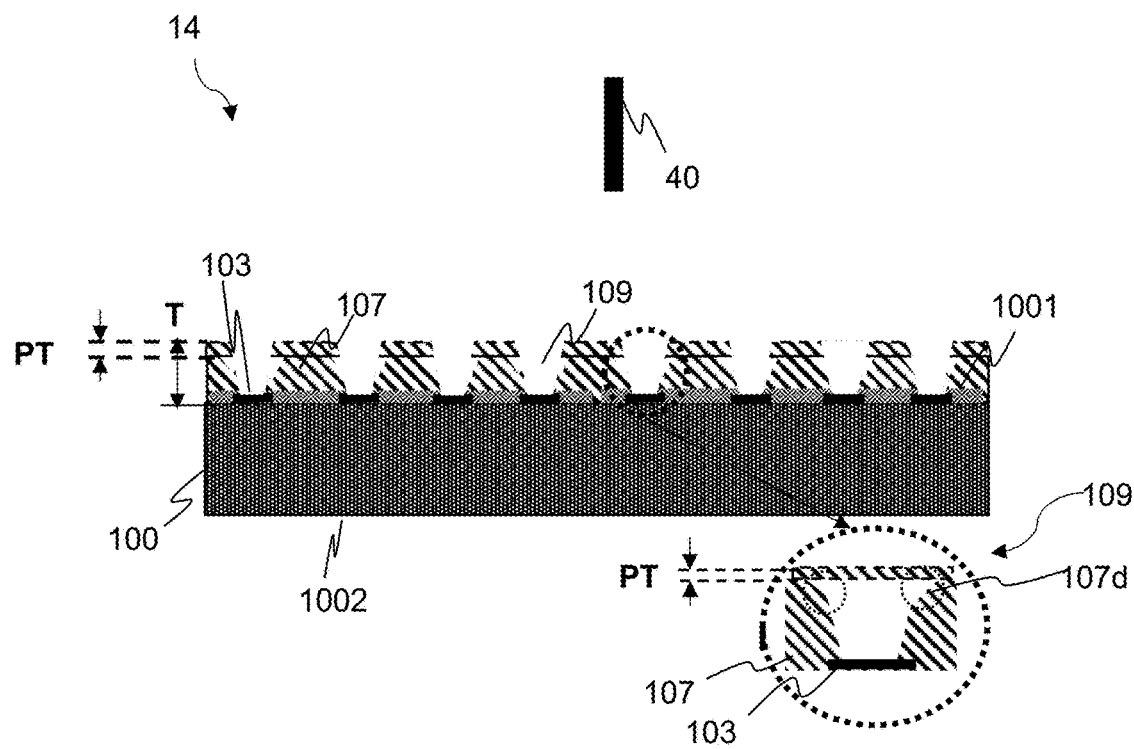

Referring to FIG. 2k. Alternative to the low-power laser etching device 30 in FIG. 2h, the second etching apparatus includes a plasma etching device 40 for performing the second etching step 14 to remove the remaining protective layer 108 from the partial protective layer openings 110 in order to form the protective layer openings 109. As described in the additional process in the Step S5, the plasma etching has a slow etching rate and thus would not damage the contact pads 103. The plasma etching includes but is not limited to carbon tetrafluoride ($CF_4$) gas plasma etching, sulfur tetrafluoride ($SF_4$) gas plasma etching, oxygen ($O_2$) gas plasma etching, Argon gas (Ar) plasma etching, or a combination thereof.

In the second etching step 14 shown in FIG. 2h, the low-power laser etching device 30 removes the remaining protective layer 108 in the partial protective layer openings 110 only, without etching away the protective layer 107 outside the partial protective layer openings 110, due to the superior directivity of the laser emitted from the low-power laser etching device 30. In contrast, plasma emitted from the plasma etching device 40 not only removes the remaining protective layer 108 in the partial protective layer openings 110, but also etches away the protective layer 107 outside the partial protective layer openings 110. As shown in FIG. 2k, the plasma etching may be performed uniformly across the protective layer 107 on the wafer active surface 1001, a thickness (PT) of the protective layer 107 outside the partial protective layer openings 110 is etched away by the plasma emitted from the plasma etching device 40 in the second etching step 14. Accordingly, the protective layer 107 has a thickness equal to T-TP, after the second etching step 14 using the plasma etching device 40.

The thickness (PT) of the protective layer 107 may be co-related with the flat thickness (R) of the remaining protective layer 108. In one embodiment, the thickness (PT) is about 10% to 30% more than the flat thickness (R), about 15% to 30% more than the flat thickness (R), about 10% to 25% more than the flat thickness (R), or about 15% to 25% more than the flat thickness (R). In one embodiment, the thickness (PT) of the protective layer 107 is about 20% more than the flat thickness (R) of the remaining protective layer 108.

In addition, since the plasma emitted from the plasma etching device 40 does not have the superior directivity as the laser emitted from the low-power laser etching device 30, the sharp edges 107c formed in the first etching step 12 is also etched away and the etched edges 107d are formed accordingly.

Figure 2L:
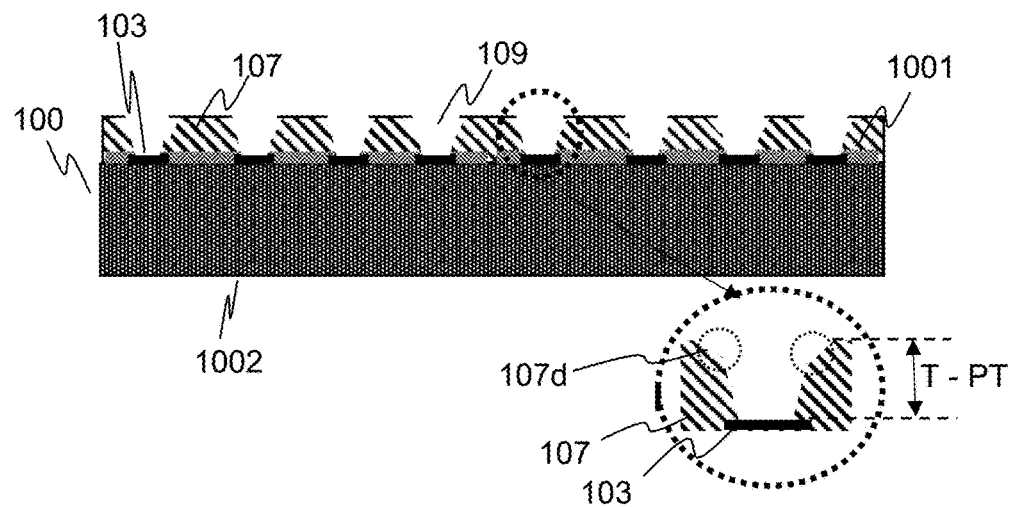

Referring to FIG. 2l. In contrast to adopting the low-power laser etching device 30, there would be no protective layer residues 112 left by adopting the plasma etching device 40 in the second etching step 14 for removing the remaining protective layer 108 in the partial protective layer openings 110. The thickness (T) of the protective layer 107 is reduced by the thickness (PT) etched away by the plasma in the second etching step 14.

Figure 2M:
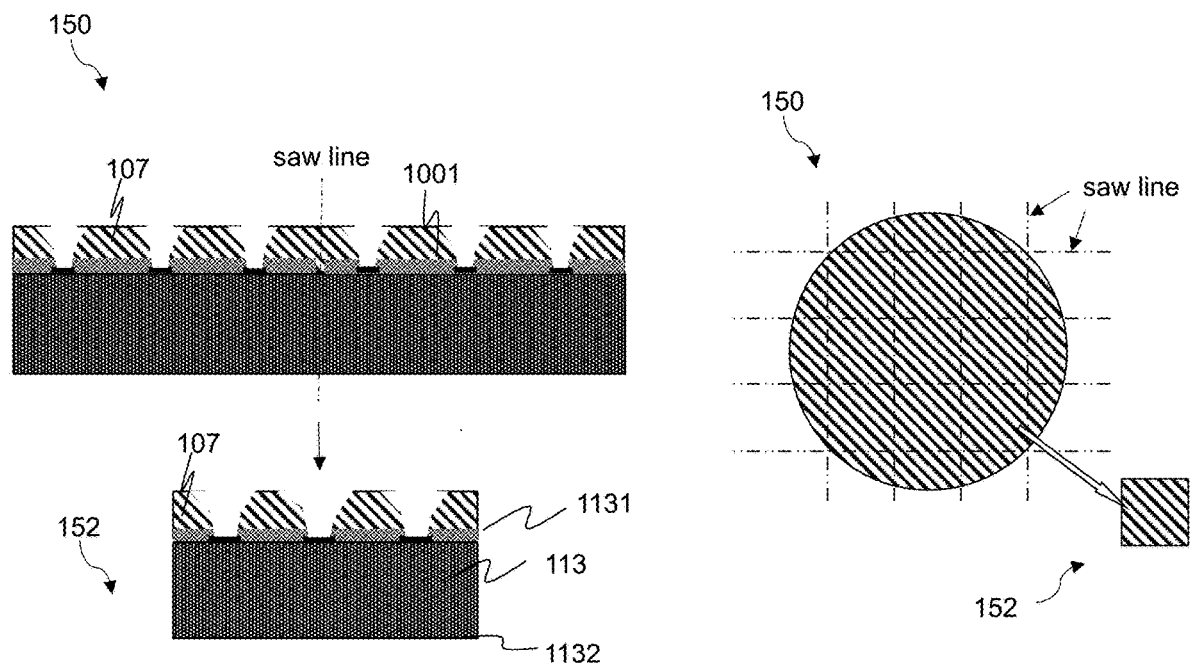

Referring to FIG. 2m, the semiconductor structure 150 is formed including the wafer 100 and the protective layer 107 with the protective layer openings 109. The semiconductor structure 150 is cut along the cutting line, to obtain a plurality of the die structures 152. The die structure 152 has the die 113 with the die active surface 1131 and the die back surface 1132, and the protective layer 107 formed on the die active surface 1131 of the die 113 with the protective layer openings 109. As shown in FIG. 2m, the etched edges 107d formed in the second etching step 14 by the plasma etching device 40 are reserved for the dies 113 after the cutting or singulation.

It is understood that the second etching step 14 of the two-step etching process 10 is also applicable to the wafer 100 with both the protective layer 107 and the adhesion promoting layer 101 (shown in FIG. 2d or FIG. 2e), since the adhesion promoting layer 101 (such as silane) can also be completely removed from the protective layer openings 109 by the low-power laser etching device 30 or the plasma etching device 40 in the second etching step 14.

FIG. 3 shows schematic diagrams of making the semiconductor structure 150 using the two-step etching process 10 according to another exemplary embodiment of the present disclosure.

Figure 3A:
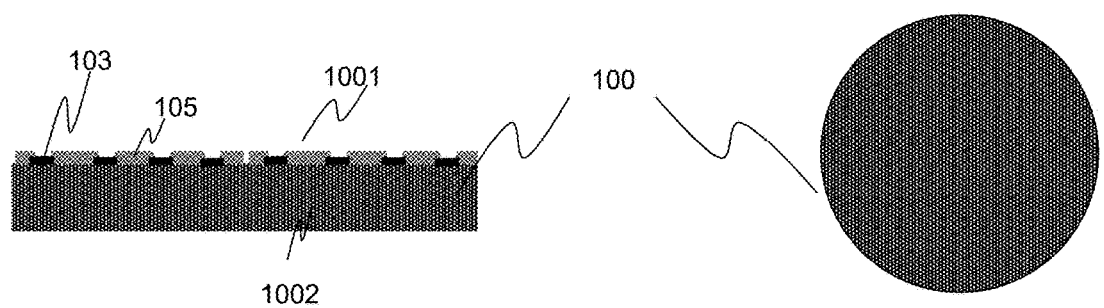
FIG. 3a-3f illustrate schematic diagrams of making the semiconductor structure using the two-step etching process in FIG. 1 with a mask layer according to another exemplary embodiment of the present disclosure.
Figure 3B:
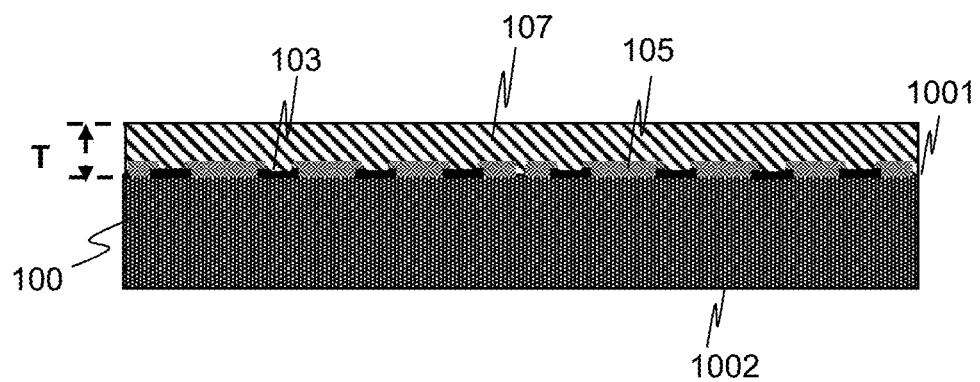

As shown in FIG. 3a and FIG. 3b, the same steps S1 and S2 are performed in this embodiment. Accordingly, the same reference numerals are also used herein for describing the same or similar features as described in FIG. 2a and FIG. 2b.

S3': applying a mask layer 114 on the protective layer 107.

Figure 3C:
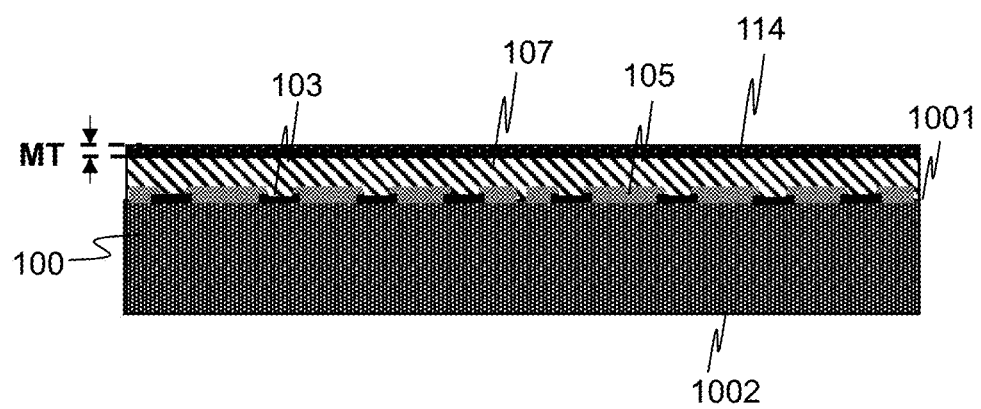

Referring to FIG. 3c, the mask layer 114 covers the protective layer 107 for protecting the protective layer 107 outside or not corresponding to the protective layer opening 109 from being etched in the two-step etching process 10.

The mask layer 114 may be made of metallic materials, such as Copper (Cu), Titanium (Ti), Nickel (Ni), alloys of Copper (Cu), Titanium (Ti), Nickel (Ni), or any combination thereof. The mask layer 114 made of metallic materials may be formed by a sputtering process, a plating process or a combination thereof. Alternatively, the mask layer 114 may be made of non-metallic materials, including non-photo-imagable etch resist polymers. The mask layer 114 made of non-metallic materials may be formed by a laminating process. Alternatively, the mask layer 114 may be made of any combination of the metallic materials and the non-metallic materials. In addition, the mask layer 114 may include a single layer or a stack of multiple layers which may be made of either the metallic materials, the non-metallic materials or any combination thereof.

The mask layer 114 may have a uniform mask thickness (MT) according to specific materials of the mask layer 114.

For example, if made of Copper (Cu), the mask thickness (MT) of the mask layer 114 may be in a range of 0.3-1 um, 0.5-1 um, 0.7-1 um or 0.9-1 um. In one embodiment, the mask thickness (MT) of the mask layer 114 is about 0.6 um.

Step S4': performing the first etching step 12 to form the partial protective layer openings 110 in the protective layer 107, and also to form a patterned mask layer 116 having mask layer openings 115. The Step S4' is similar to the Step S3; and the same reference numerals are also used herein for describing the same or similar features accordingly.

Figure 3D:
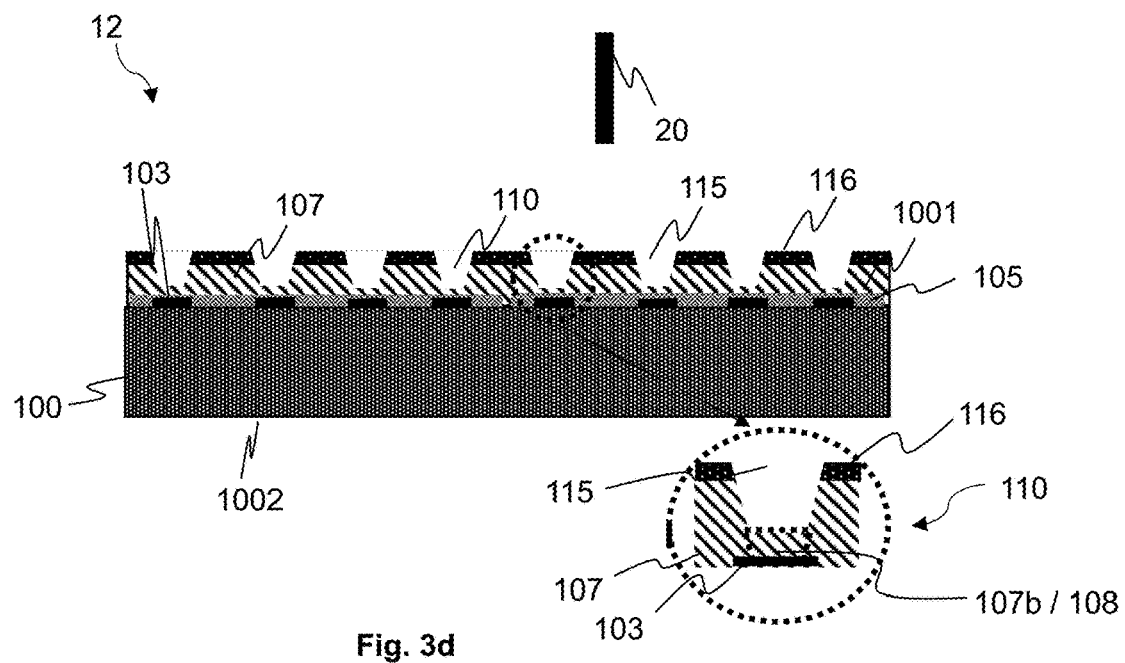

Referring to FIG. 3d, the first etching step 12 is performed to the protective layer 107 by the high-power laser etching device 20 for forming the partial protective layer openings 110. In addition to the protective layer 107, the laser emitted from the high-power laser etching device 20 can also etch the mask layer 114 for forming the mask layer openings 115. Accordingly, the mask layer 114 is turned into the patterned mask layer 116 having the mask layer openings 115.

Alternatively, the first etching step 12 may be performed in two sub-steps (not shown). In a first sub-step, the laser emitted from the high-power laser etching device 20 is strong enough to form the mask layer openings 115 in the mask layer 114; then the high-power laser etching device 20 is adjusted in a second sub-step to lower the normal energy (E) for etching the top portion 107a of the protective layer 107 to form the partial protective layer openings 110.

Step S5': performing the second etching step 14 to form the protective layer openings 109 in the protective layer 107. The Step S5' is similar to the Step S4; and the same reference numerals are also used herein for describing the same or similar features accordingly.

Figure 3E:
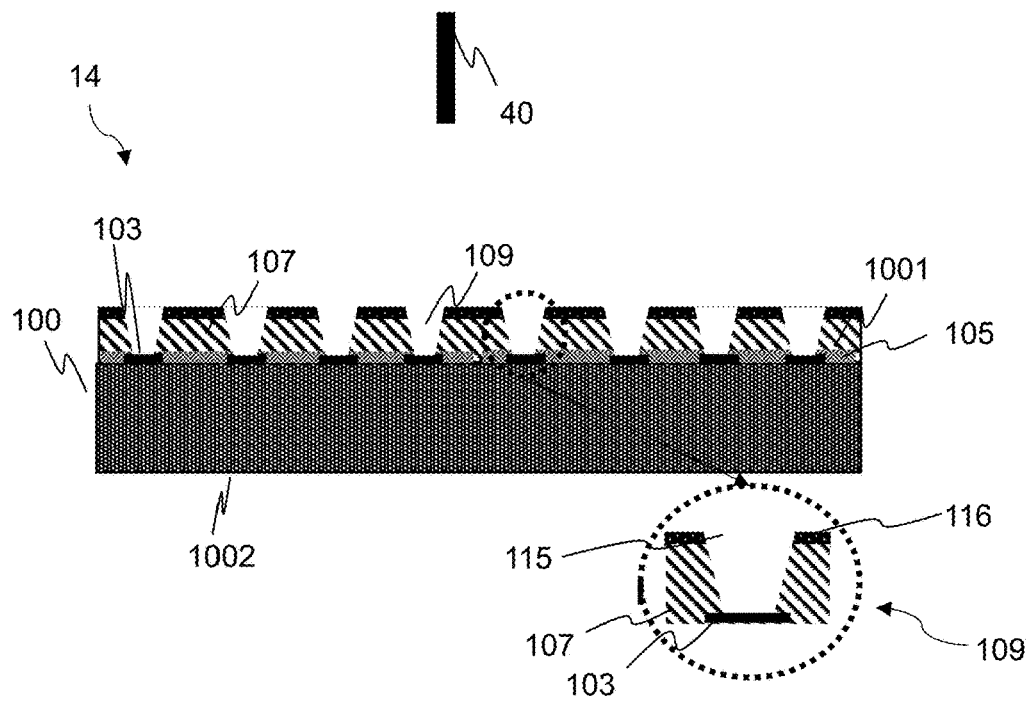

Referring to FIG. 3e, the second etching step 14 is performed with the plasma etching device 40 to remove the remaining protective layer 108 exposed from the partial protective layer openings 110, without causing damages to the contact pads 103.

Similar to FIG. 2k, the plasma emitted from the plasma etching device 40 completely removes the remaining protective layer 108 exposed from the mask layer openings 115, without leaving the protective layer residues 112 in the protective layer openings 109. Meanwhile, the patterned mask layer 116 protects the protective layer 107 outside the protective layer openings 109 from being etched by the plasma. In contrast to FIG. 2k, the flat thickness (T) of the protective layer 107 is not reduced by the thickness (PT) in the second etching step 14. In addition, the sharp edges 107c formed in the first etching step 12 is also reserved in the second etching step 14, due to the protection provided by the patterned mask layer 116.

The patterned mask layer 116 in the Step S5' provides beneficial advantages. One one hand, the additional process shown in FIG. 2i is not needed due to adoption of the plasma etching device 40. On the other hand, the protective layer 107 outside the protective layer openings 109 is not etched and thus can provide enough protection to the wafer active surface 1001 of the wafer 100 and the die active surface 1131 of the die 113 in following processes after the sawing. In addition, the sharp edges 107c meets product specifications of final electronic products produced from the semiconductor structure 150. In other words, the second etching step 14 in FIG. 3e is better controlled for removing the remaining protective layer 108 without causing undesirable damages.

Step S6': removing the patterned mask layer 116 from the protective layer 107.

The patterned mask layer 116 is removed from the protective layer 107 by any known processes, such as a mechanical process, a chemical process, or any combination thereof, according to the materials of the mask layer 114. For example, if the mask layer 114 is made of metallic materials, such as Copper (Cu), Titanium (Ti), Nickel (Ni), alloys of Copper (Cu), Titanium (Ti), Nickel (Ni), or any combination thereof. The patterned mask layer 116 can be removed by immersing or soaking the semiconductor structure 150 into a chemical erosive solution. For example, the semiconductor structure 150 is immersed or soaked in a hydrogen peroxide ($H_2O_2$) solution with a concertation of 5-10% in volume for 1 to 5 minutes. Alternatively, the hydrogen peroxide solution ($H_2O_2$) may be sprayed on the patterned mask layer 116. In addition, a sulfonic acid solution ($H_2SO_4$) with a concertation of 5-10% in volume may be also added to the hydrogen peroxide solution ($H_2O_2$) for accelerating removal of the patterned mask layer 116.

Figure 3F:
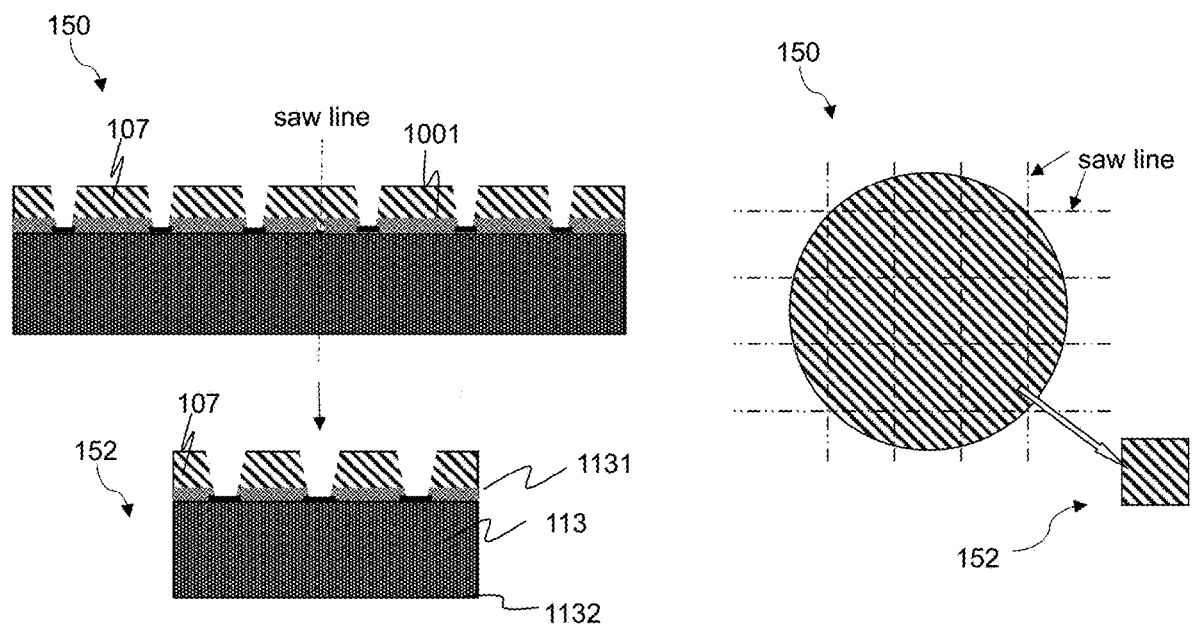

Referring to FIG. 3f. Similar to FIG. 2j, the semiconductor structure 150 is formed including the wafer 100 and the protective layer 107 with the protective layer openings 109, after removing the patterned mask layer 116. The semiconductor structure 150 is cut along the cutting line, to obtain a plurality of the die structures 152. The die structure 152 has the die 113 with the die active surface 1131 and the die back surface 1132, and the protective layer 107 formed on the die active surface 1131 of the die 113 with the protective layer openings 109.

It is understood that the mask layer 114 is also applicable to the protective layer 107 having the varied thickness (T') as shown in FIG. 2c in accordance with the Steps S3' to S6'. In addition, the adhesion promoting layer 101 may also be applicable to the wafer active surface 1001 before the protective layer 107 is formed in FIG. 3b.

FIG. 4 shows schematic diagrams of making the semiconductor structure 150 using the two-step etching process 10 according to another exemplary embodiment of the present disclosure.

Figure 4A:
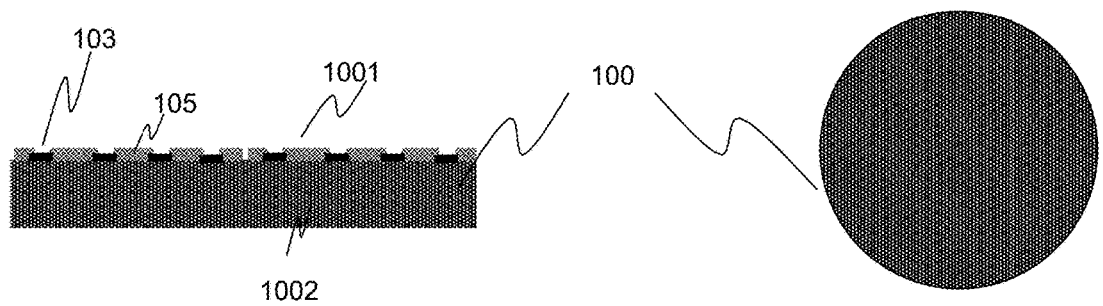
FIG. 4a-4e illustrate schematic diagrams of making the semiconductor structure using the two-step etching process in FIG. 1 with a patterned mask layer according to another exemplary embodiment of the present disclosure.
Figure 4B:
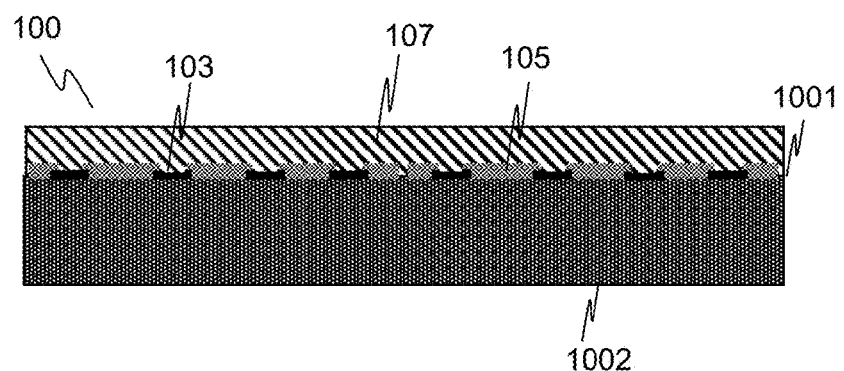

As shown in FIG. 4a and FIG. 4b, the same steps S1 and S2 are performed for this embodiment. Accordingly, the same reference numerals are also used herein for describing the same or similar features as described in FIG. 2a and FIG. 2b or in FIG. 3a and FIG. 3b.

Step S3": providing the patterned mask layer 116 having mask layer openings 115.

Figure 4C:
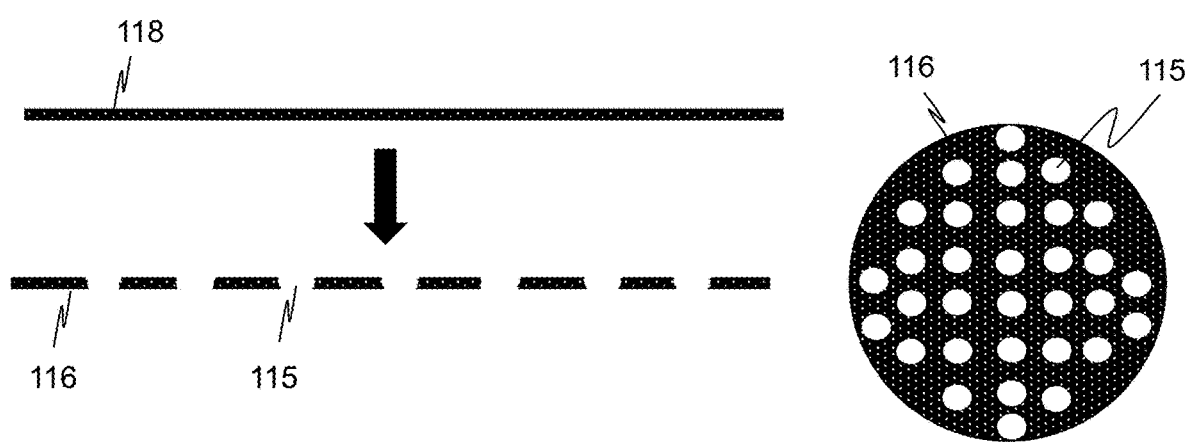

Referring to FIG. 4c, a mask layer sheet 118 is provided. The mask layer sheet 118 is made of the metallic materials, the non-metallic materials or any combination thereof, as described in FIG. 3c. The mask layer openings 115 is then made in the mask layer sheet 118 by any known process for forming the patterned mask layer 116. For example, the mask layer openings 115 are made by etching or mechanical stamping. The patterned mask layer 116 may have any shape for covering the protective layer 107. In one embodiment, the patterned mask layer 116 has a same circular shape as the wafer 100. In addition, the patterned mask layer 116 may have a same or larger size to completely cover the protective layer 107 on the wafer active surface 1001.

Step S4": applying the patterned mask layer 116 on the protective layer 107.

Figure 4D:
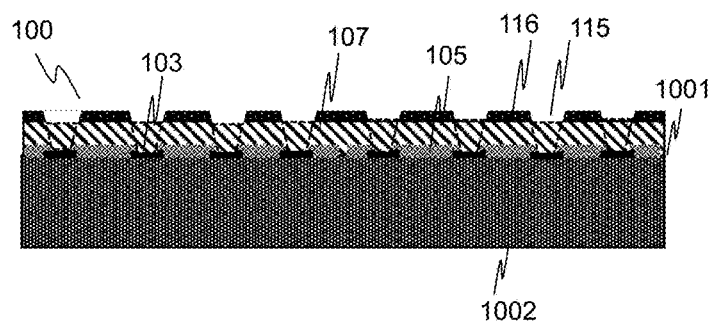

Referring to FIG. 4d, the patterned mask layer 116 is applied on the protective layer 107 in such as manner that the mask layer openings 115 correspond to the contact pads 103 on the wafer active surface 1001, respectively.

The two-step etching process 10 is then performed for forming the semiconductor structure 150, including Step S5": performing the first etching step 12 to form the partial protective layer opening 110 in the protective layer 107; and Step S6": performing the second etching step 14 to form the protective layer opening 109 in the protective layer 107. The Step S5" and the Step S6" herein are performed in the same manner as described in FIG. 3d and FIG. 3e, respectively.

Compared with the Step S4' shown in FIG. 3d, the mask layer openings 115 guide the high-power laser etching device 20 to remove the top portion 107a of the protective layer 107 for forming the partial protective layer openings 110 in precise locations on the wafer active surface 1001.

In both the first etching step 12 and the second etching step 14, the protective layer 107 covered by the patterned mask layer 116 is not etched away and thus provides sufficient protections to the wafer 100 in following processes. The contact pads 103 are exposed from the protective layer openings 109 of the protective layer 107 and the mask layer openings 115 of the patterned mask layer 116, without being damaged in the two-step etching process 10.

Step S7": removing the patterned mask layer 116 from the protective layer 107.

Figure 4E:
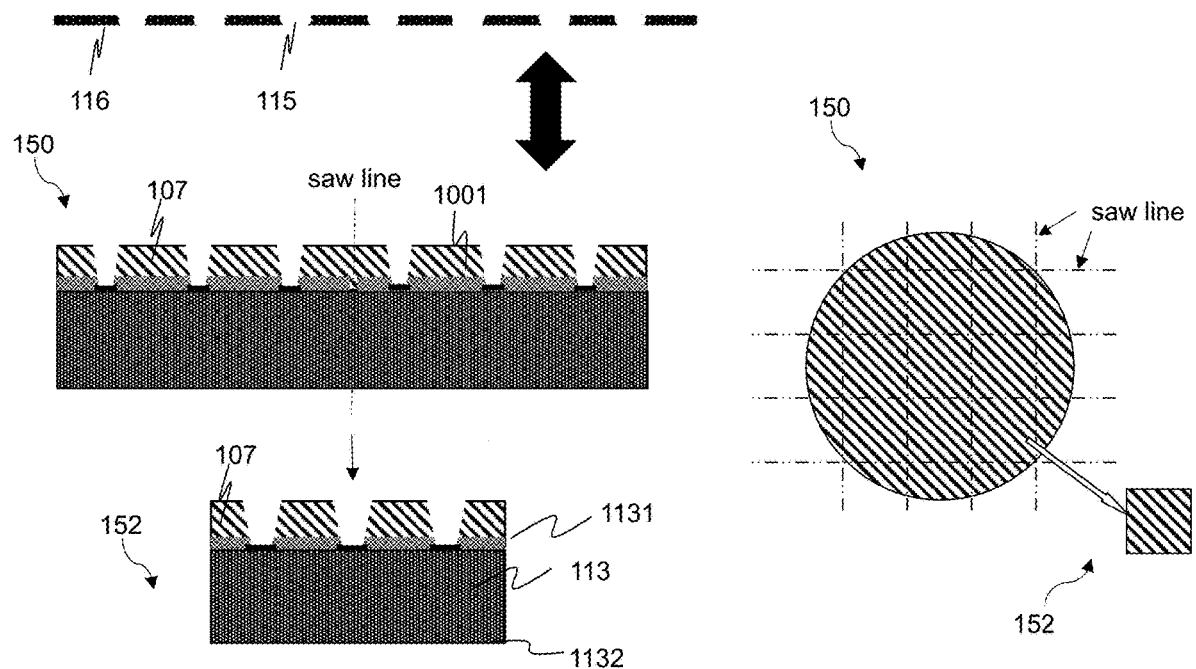

Referring to FIG. 4e. Similar to FIG. 3f, the patterned mask layer 116 is removed from the protective layer 107 by any known processes, such as a mechanical process, a chemical process, or any combination thereof, according to the specific materials of the mask layer 114. The sharp edges 107c is also reserved during removal of the patterned mask layer 116.

The semiconductor structure 150 is formed including the wafer 100 and the protective layer 107 with the protective layer openings 109. The semiconductor structure 150 is cut along the cutting line, to obtain a plurality of the die structures 152. The die structure 152 has the die 113 with the die active surface 1131 and the die back surface 1132, and the protective layer 107 formed on the die active surface 1131 of the die 113 with the protective layer openings 109.

Although the two-step etching process 10 is described in the embodiments, it is understood that the semiconductor structure 150 can also be formed by performing multi-step etching processes following the same principles of the two-step etching process 10 as described in the present disclosure. In a final etching step of the multi-step etching process, the remaining protective layer 108 in the partial protective layer openings 110 is etched away by using proper etching devices in order to not cause damages to the contact pads 103.

For example, the multi-step etching process may be a three-step etching process to form the semiconductor structure 150 by firstly conducting an initial etching step for removing an initial portion of the protective layer 107, secondly conducting an intermediate etching step for removing a middle portion of the protective layer 107 below the initial portion, and a final etching step for removing a final portion of the protective layer 107 below the middle portion. In the final etching step, the protective layer 107 is completely etched away by the low-power laser etching device 30 or the plasma etching device 40, without damaging the contact pads 103.

Referring to FIG. 5 to FIG. 9 in which another semiconductor structure 155 is formed by using the two-step etching process 10 as described above.

Figure 5A:
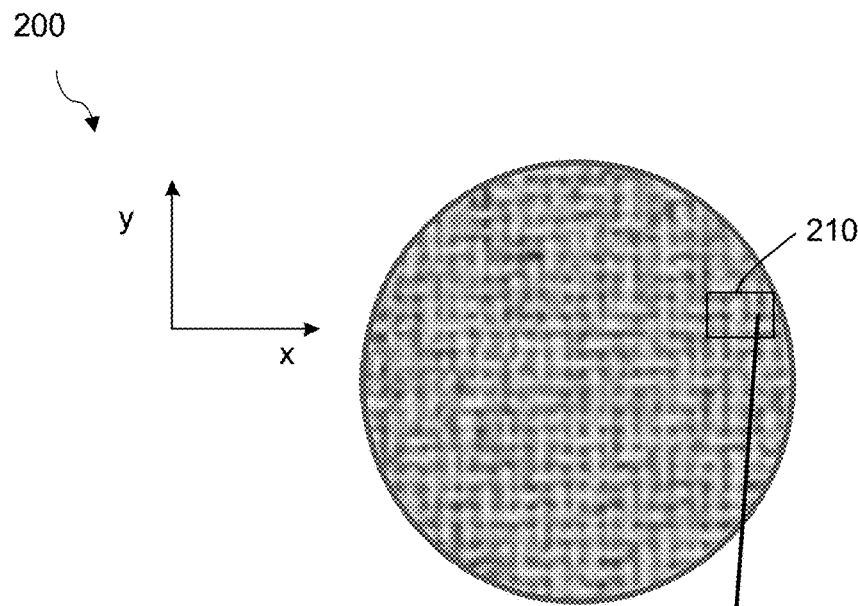
FIG. 5a-5b show an image of a top view of a processed semiconductor wafer and a simplified cross-section view of a portion of the processed semiconductor wafer.
Figure 5B:
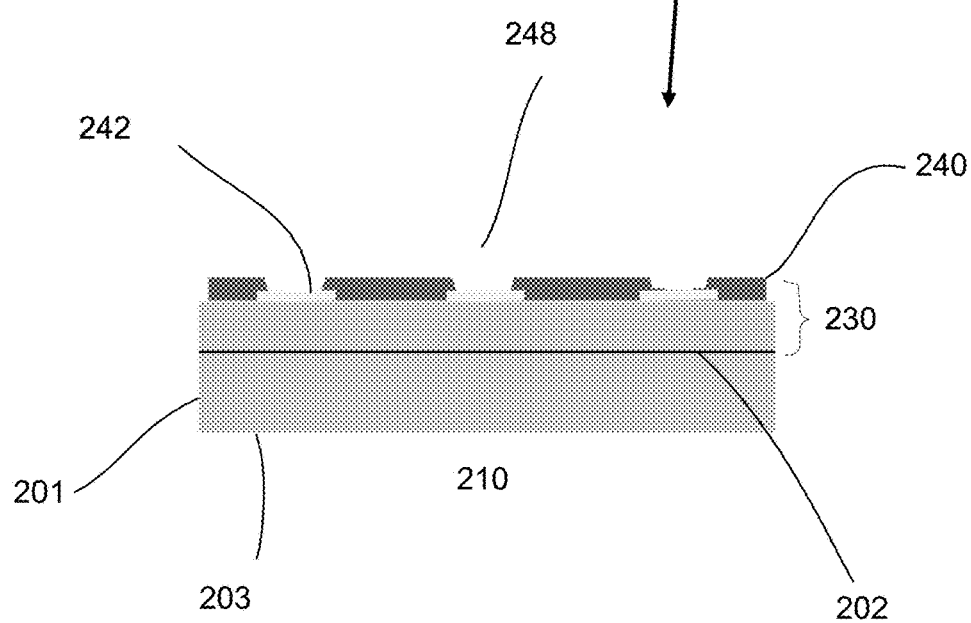

FIG. 5 shows an image of a top view of an exemplary embodiment of a processed semiconductor wafer (also called processed wafer) 200 and a simplified cross-section view of a portion of the processed semiconductor wafer 200. The processed semiconductor wafer 200 may include a semiconductor wafer (also called wafer) 201. The semiconductor wafer 201 may be a lightly doped p-type silicon wafer. Alternatively, the semiconductor wafer 201 may be a lightly doped n-type silicon wafer. Other types of wafers may also be employed. For example, the wafer 201 may be a silicon carbide (SiC) wafer, a gallium nitride (GaN) wafer, a gallium arsenide (GaAs) wafer, or an indium phosphide (InP) wafer. Other types of wafers may also be useful.

The processed semiconductor wafer 200 includes multiple dies (also called devices) 210. The dies 210 are arranged in rows along a first (x) direction and columns along a second (y) direction. Saw streets or dicing lines (not shown) separate the rows and columns of dies 210 in the x and y directions. The cross-sectional view of the portion of the processed semiconductor wafer 200 may be a simplified view of the die 210.

Circuit components (not shown) of the dies 210 of the processed wafer 200 are formed on an active wafer surface 202 of the semiconductor wafer 201. For example, the active wafer surface 202 may be the top wafer surface of the wafer 201. An opposing wafer surface 203 may be referred to as the bottom or the inactive wafer surface of the wafer 201. The circuit components may be formed using front-end-of-line (FEOL) processing.

A back-end-of-line (BEOL) dielectric stack 230 with interconnects (not shown) is formed on the active wafer surface 202 of the wafer 201. For example, the BEOL dielectric stack 230 may cover the circuit components of the dies 210. The interconnects of the BEOL dielectric stack 230 interconnect the circuit components. The BEOL dielectric stack 230 may include multiple interconnect levels. For example, metal lines coupled to via contacts may be provided in different BEOL dielectric layers of the interconnect levels of the BEOL dielectric stack 230. The BEOL dielectric layers may include low k dielectrics, ultra low k dielectrics, as well as GaN and germanium (Ge) coated materials. Other types of dielectrics or dielectric layers may also be useful. Low-k dielectrics or low-k dielectric layers and ultra low-k dielectrics or ultra low-k dielectric layers may be collectively referred to as low-k dielectrics or low-k dielectric layers. Other types of BEOL dielectric layers may also be useful.

A top interconnect level of the BEOL dielectric stack 230 may be a pad level. The pad level includes a passivation layer 240 with die bond pads 242 for providing external connections to the circuit components. The die bond pads 242, for example, may be formed of aluminum. Other types of conductive materials, such as copper (Cu), nickel (Ni), palladium (Pd), gold (Au), chromium (Cr) or a combination or alloys thereof, such as Al—Cu, may also be used to form the die bond pads 242.

The passivation layer 240, for example, may be a passivation stack. The passivation stack may include a combination of dielectric layers, such as silicon oxide and silicon nitride layers. Other types of dielectric layers may also be useful. In some embodiments, the passivation layer 240 may be formed from a single dielectric layer.

As shown, the passivation layer 240 includes pad openings 248 to expose the die bond pads 242. The pad openings 248, in one embodiment, are smaller than the die bond pads 242. For example, the passivation layer 240 has a top surface which is above the top surface of the die bond pads 242, with the pad openings 248 being smaller than the die bond pads 242. As shown, the passivation layer 240 covers an edge portion of the die bond pads 242. The pad openings 248, in one embodiment, are patterned using conventional masking and etching processes. For example, isotropic etching, such as reactive ion etching (RIE), is employed to etch the passivation layer 240 with a patterned photoresist mask to form the pad openings 248. Other techniques for forming the pad openings 248 may also be useful.

The processed wafer 200 may be an incoming processed wafer from an external supplier. For example, a packaging vendor may receive the processed wafer 200 from a wafer fab. The processed wafer 200 may be further processed by the packaging vendor to form individual semiconductor packages. In some cases, further processing of the processed wafer may be performed by the wafer fab having packaging capabilities.

Figure 6A:
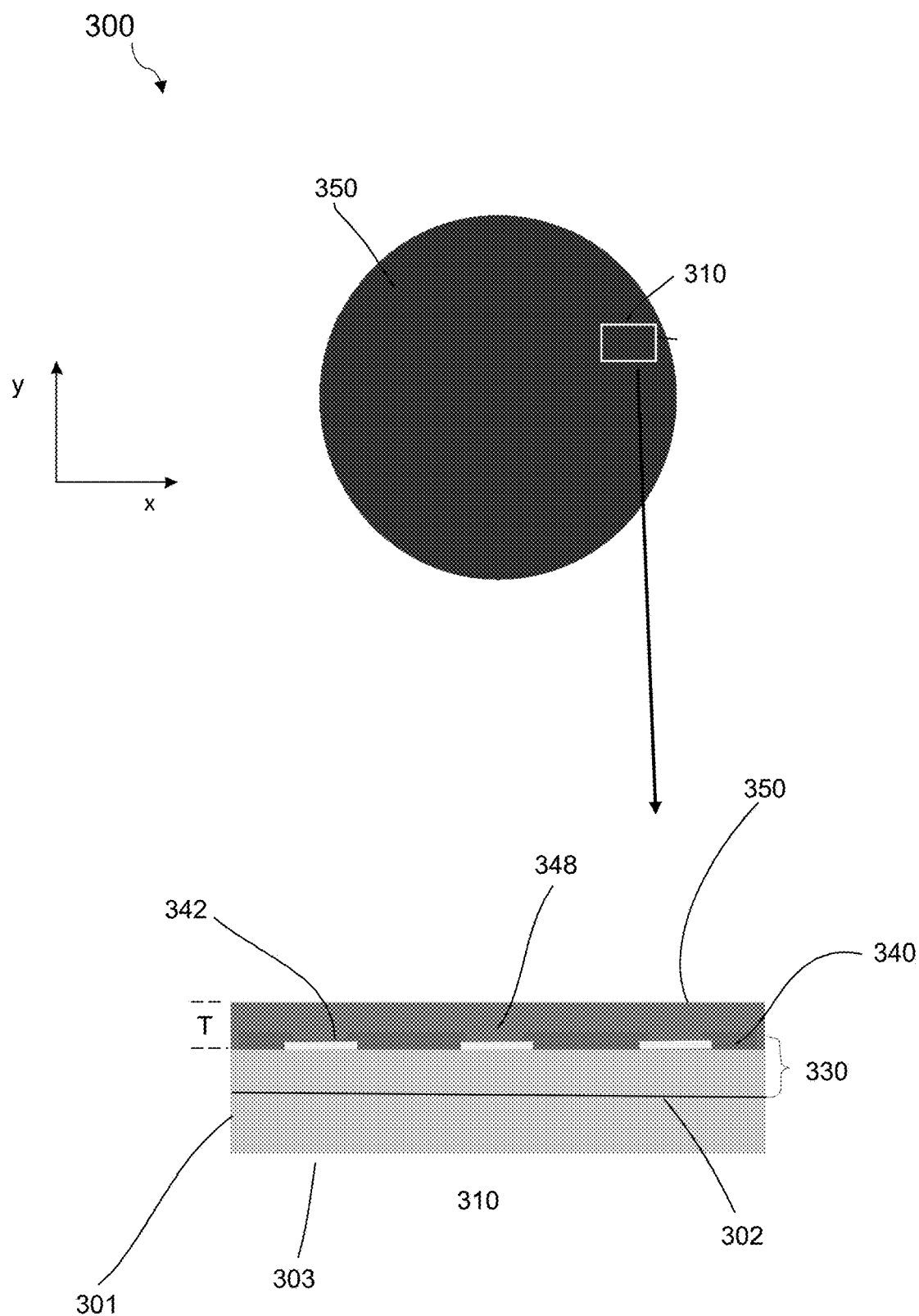
FIGS. 6a-6c illustrate an embodiment of a process for forming a cover layer on the top of the processed wafer and forming via openings in a cover layer formed on the top of the processed semiconductor wafer.
Figure 6B:
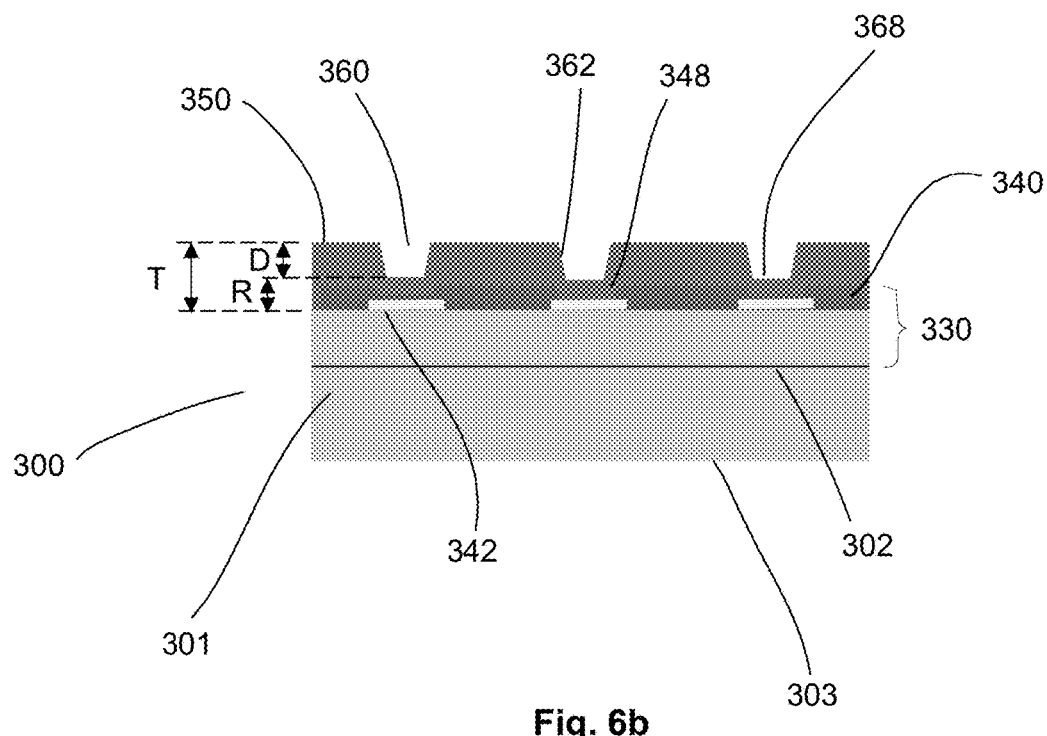
Figure 6C:
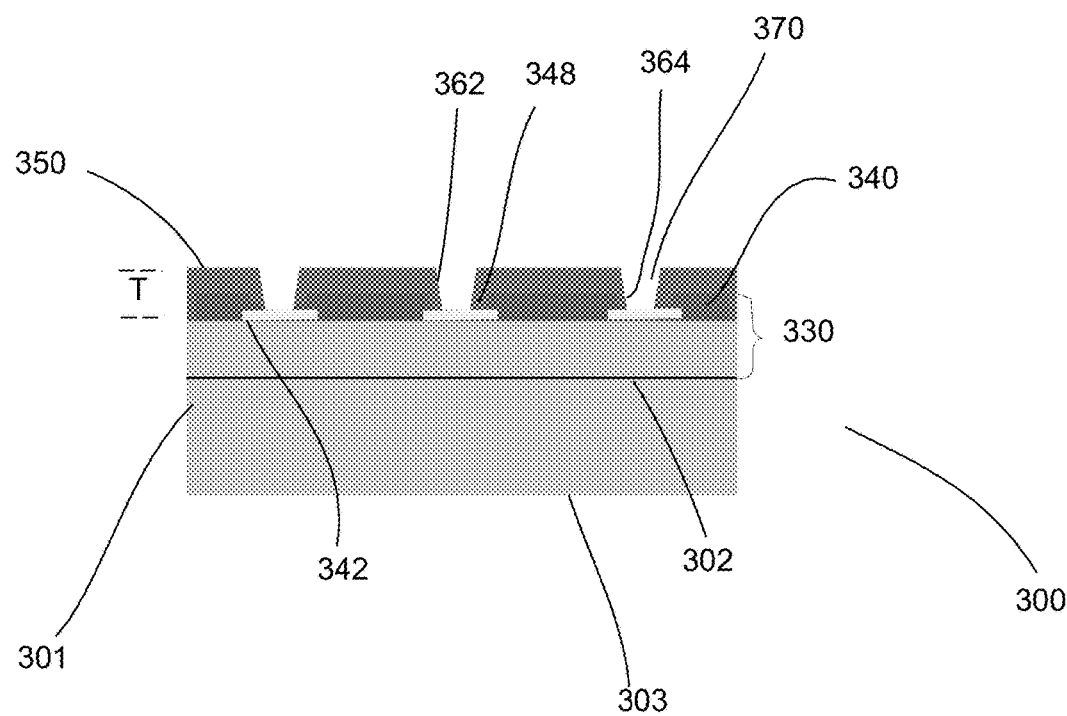

FIGS. 6a-6c show an embodiment of a process for forming via openings in a cover layer 350 on a processed semiconductor wafer (also called processed wafer) 300. Similar to the protective layer 107 in FIG. 1 to FIG. 4, the cover layer 350 is another type of insulating layer to die bond pads 342. In particular, FIG. 6a shows an image of a top view of the processed semiconductor wafer 300 with the cover layer 350 and a simplified cross-sectional view of a portion of the processed semiconductor wafer 300 with the cover layer 350 while FIGS. 6b-6c show simplified cross-sectional views of the portion of the processed semiconductor wafer 300 with the cover layer 350. The cross-sectional views of FIGS. 6a-6c, for example, correspond to a die (also called device) 310 on the processed wafer 300. The processed semiconductor wafer 300 may be similar to the processed semiconductor wafer 200 described in FIG. 5. Common elements may not be described or described in detail.

Referring to FIG. 6a, the processed semiconductor wafer 300, for example, includes circuit components (not shown) of the dies 310 formed on an active wafer surface 302 of a wafer 301. An opposing surface 303 may be an inactive wafer surface. The circuit components may be formed using front-end-of-line (FEOL) processing. A back-end-of-line (BEOL) dielectric stack 330 with interconnects (not shown) is formed on the active wafer surface 302 of the wafer 301. The top interconnect level of the BEOL dielectric stack 330 may be the pad level, which includes a passivation layer 340 with pad openings 348 to expose the die bond pads 342.

The cover layer 350 is disposed on the processed wafer 300, covering the top of the BEOL dielectric stack 330. For example, the cover layer 350 is formed on the top of the BEOL dielectric stack 330 of the processed wafer 300. The cover layer 350 may be formed by, for example, the packaging vendor. Alternatively, the cover layer 350 may be formed by the wafer fab. Other arrangements of forming the cover layer 350 on the processed wafer 300 may also be useful.

The cover layer 350, in one embodiment, is a dielectric cover layer. Various types of dielectric materials, such as polyimide, epoxy resin, and polybenzoxazole (PBO) as well as other types of dielectric or insulating materials or a combination of insulating materials, may also be used to form the cover layer 350.

In one embodiment, the cover layer 350 is a composite cover layer having a vibration damping composition or agent. The composite cover layer 350 includes a base cover layer containing fillers or granules. In one embodiment, the base cover layer is an organic polymer matrix material. Various types of polymers may be used for the base cover layer. For example, polymers may include thermosetting plastics or thermoplastics, such as polyimides, epoxy resins, as well as other types of polymers. In one embodiment, the base cover layer includes a resin, such as epoxy or cyanate esters. Preferably, the base cover layer is a low viscosity resin, such as a biphenyl epoxy resin.

As for the fillers, they may be organic-based, inorganic-based, or a combination thereof. For example, the fillers may include silica ($SiO_2$) fillers, amorphous aluminum oxide ($\alpha$-$Al_2O_3$) fillers, or a combination thereof. Other types of non-conductive fillers may also be useful. Other types of non-conductive fillers may also be useful. For example, the fillers may be silica, glass beads, sand, or a combination thereof. The fillers, for example, may be spherical-shaped fillers. The fillers are non-uniformed sized fillers having a diameter of about 0.5-12 um or 0.5-10 um. Other sized fillers may also be useful, including nano-sized fillers. In addition, the fillers may have any shape. Providing non-uniformed sized fillers enables the cover layer to contain a higher density of fillers. For example, smaller sized fillers can fill the gaps between the larger sized fillers. In one embodiment, the concentration of fillers in the cover layer 350 is from about 70-90 weight percent (wt %). In another embodiment, the concentration of fillers in the cover layer 350 is from about 80-90 wt %. Other concentrations of fillers in the cover layer 350 may also be useful.

In one embodiment, the cover layer 350 is tailored to prevent cracking and chipping in the BEOL dielectric stack 330 during dicing. Providing the cover layer 350 for other purposes may also be useful. In one embodiment, the cover layer 350 has a Young's Modulus and Breaking Strength to reduce or prevent cracking and chipping during dicing of the wafer. In one embodiment, the Young's Modulus of the cover layer 350 is about 10,000-25,000 MPa, about 14,000-25,000 MPa, about 15,000-25,000 MPa, about 16,000-25,000 MPa, about 15,000-20,000 MPa or about 20,000-25,000 MPa. As for the Breaking Strength of the cover layer 350, it may be about 45-150 MPa, about 70-150 MPa, about 70-120 MPa, about 70-105 MPa, about 80-120 MPa or about 90-100 MPa. In one embodiment, the coefficient of thermal expansion of the cover layer 350 is about 6-20 ppm/° C. The cover layer 350 may have a temperature stability through the region −65-+300° C.

In one embodiment, a thickness (T) of the cover layer 350 is about 10-100 um, 15-100 um, 20-100 um, 25-100 um, 45-100 um or 60-100 um. A thickness tolerance of the cover layer 350 may be ±1-5 um, depending on the thickness (T) of the cover layer 350. Providing the cover layer 350 with other thicknesses (T) may also be useful.

Various techniques may be used to form the cover layer 350. The technique for forming the cover layer 350, for example, may depend on the type of cover layer 350 used. In the case of the composite cover layer 350, it may be formed by compression molding or lamination, such as vacuum type or roller type lamination. Other techniques for forming the composite cover layer 350 may also be useful. For example, the composite cover layer 350 may be formed by spin-coating, slit die or printing, or other types of printing techniques.

In some embodiments, prior to forming the cover layer 350, an adhesion-promoting layer (not shown) may be formed over the top of the BEOL dielectric stack 330. The adhesion-promoting layer enhances the bonding force at the interface of the top of the BEOL dielectric stack 330 and the subsequently formed cover layer 350. The adhesion-promoting layer, for example, may be silane. Other types of adhesion-promoting layers may also be useful.

Referring to FIG. 6b, the process of forming via openings in the cover layer 350 on the processed wafer 300 commences. Shown is a cross-sectional view of a portion of the processed wafer 300 with the cover layer 350 on the top of the BEOL dielectric stack 330. The cross-sectional view of the portion of the processed wafer 300, for example, corresponds to the die 310.

To form the via openings, an etch process is employed. In one embodiment, the etch process is a multi-step etching process. In one embodiment, the multi-step etching process includes first and second etch processes. As shown, the first etch process etches the cover layer 350 to form partial via openings 360. For example, the first etch process etches the composite cover layer 350 to form partial via openings 360. Alternatively, the cover layer 350 may be other types of insulating or dielectric layers. The positions of the partial via openings 360 correspond to the positions of the die bond pads 342 on the top of the BEOL dielectric stack 330. Preferably, the positions of the partial via openings 360 are selected to result in the bottoms of the complete via openings located at about centers of the die bond pads 342.

In one embodiment, the first etch process is a laser etch process, such as a laser drilling using a pulsed ultra-violet (UV) laser ablation or drilling tool. The laser drilling, for example, is performed with using a normal number of pulses (P) and normal energy (E). In one embodiment, the normal energy (E) is about in a range of 1-2 Joules, 1.2-2 Joules, 1.4-2 Joules, 1.6-2 Joules or 1.8-2 Joules. In one embodiment, the normal energy (E) is in a range of 1.2-1.5 Joules. In one embodiment, the normal number of pulses (P) about is in a range of 5-20 pulses, 7-20 pulses, 9-20 pulses, 11-20 pulses, 13-20 pulses, 15-20 pulses or 17-20 pulses. In one embodiment, the normal number of pulses (P) is in a range of 7-10 pulses. By using a normal level of E and P, forming the partial via openings 360 can be achieved faster.

The first etch process is controlled to etch a partial depth of the cover layer 350 without exposing the die bond pads 342. In one embodiment, the first etch process etches the cover layer 350 to a depth (D). The depth (D) is less than the thickness (T) of the cover layer 350. In one embodiment, the depth (D) is about in a range of 5-60% of the thickness (T) of the cover layer 350, in a range of 10-60% of the thickness (T) of the cover layer 350, in a range of 15-60% of the thickness (T) of the cover layer 350, in a range of 20-60% of the thickness (T) of the cover layer 350, in a range of 30-60% of the thickness (T) of the cover layer 350, in a range of 40-60% of the thickness (T) of the cover layer 350, or in a range of 50-60% of the thickness (T) of the cover layer 350. In one embodiment, the depth (D) is about in a range of 10-20% of the thickness (T) of the cover layer 350. This leaves a remaining portion of the cover layer 350 covering the die bond pads 342. The remaining portion of the cover layer 350 covering the die bond pads 342 has a flat thickness (R), which is about in a range of 1-8 um, 2-8 um, 3-8 um, 4-8 um, 5-8 um, 6-8 um or 7-8 um. In one embodiment, the flat thickness (R) of the remaining portion of the cover layer 350 is around 2 um. The cover layer 350 remaining over the die bond pads 342 forms a bottom or bottom surface 368 of the partial via openings 360. The bottom surface 368 of the partial via openings 360 forms a top of the remaining portions of the cover layer 350 covering the die bond pads 342. Other values of depth (D) may also be useful. Preferably, the depth (D) is selected so that the first etch process does expose the die bond pads 342. For example, at least a portion of the cover layer 350 remains over die bond pads 342.

In one embodiment, the partial via openings 360 may be circular-shaped via openings. Other shaped openings may also be formed. For example, the shape of the partial via openings 360 may depend on design requirements. As shown, the partial via openings 360 have slanted sidewalls 362, tapering inwards from the top of the cover layer 350 towards the bottom of the partial via openings 360. In one embodiment, the first etch process produces laser drilled or laser etched partial via opening sidewalls 362. The partial via opening sidewalls 362 may be referred to as the upper via opening sidewalls, which are formed by the first etch process.

In one embodiment, as shown in FIG. 6c, the second etch process removes the remaining portion of the cover layer 350 over the die bond pads 342. For example, the second etch process forms via openings 370 in the cover layer 350, exposing the die bond pads 342. In one embodiment, the second etch process is a laser etch process. The second etch process is performed using low P and E. The low P has fewer pulses than the normal P (low P <normal P) and the low E is lower in energy than normal E (low E <normal E). The second etch process using low P and low E avoids damaging the die bond pads 342. The low E may be about in a range of 0.3-0.6 Joule, 0.4-0.6 Joules or 0.3-0.5 Joule. In one embodiment, the low E is in a range of 0.3-0.4 Joule. In another preferred embodiment, the low E is in a range of 0.5-0.6 Joule. The low P is determined by the depth (D) and values of the low E. For example, the depth (D) of 1 um may be removed with one pulse when the low is set at 0.3-0.4 Joule; while the depth (D) of 1.3 um with one pulse when the low E is set at 0.5-0.6 Joule. Other values for low P and the low E which avoid damaging the die bond pads 342 may also be useful. Preferably, low P and the low E are selected to remove the remaining portion of the cover layer 350 as quickly as possible without damaging the die bond pads 342.

In one embodiment, low via opening sidewalls 364 continues from the upper via openings sidewalls 362. As shown, the upper and lower via openings sidewalls 362, 364 form tapered via opening sidewalls of the via openings 370. In one embodiment, the second etch process produces laser drilled or laser etched lower via opening sidewalls 364.

After forming the via openings 370 in the cover layer 350, the process may continue. For example, the process may continue until the processed wafer 300 is singulated into individual dies 310 and packaged to form packaged dies.

Figure 7A:
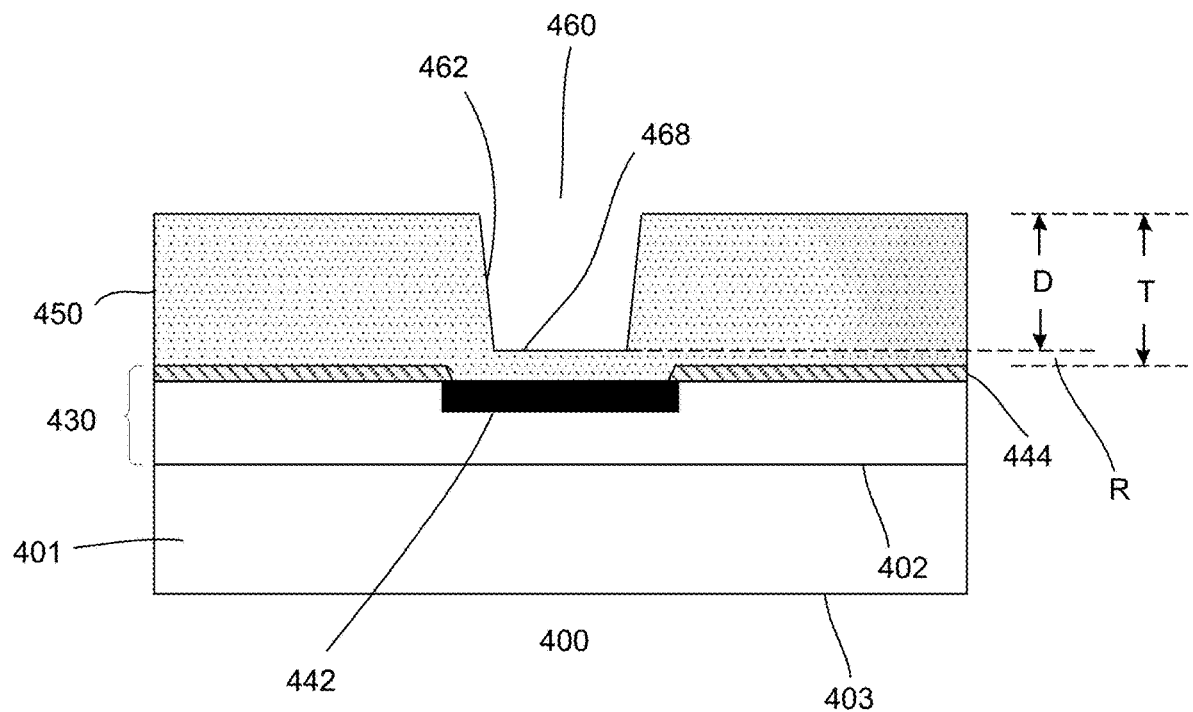
FIGS. 7a-7b illustrate simplified cross-sectional views of another embodiment of a process for forming via openings in the cover layer on the top of the processed semiconductor wafer.
Figure 7B:
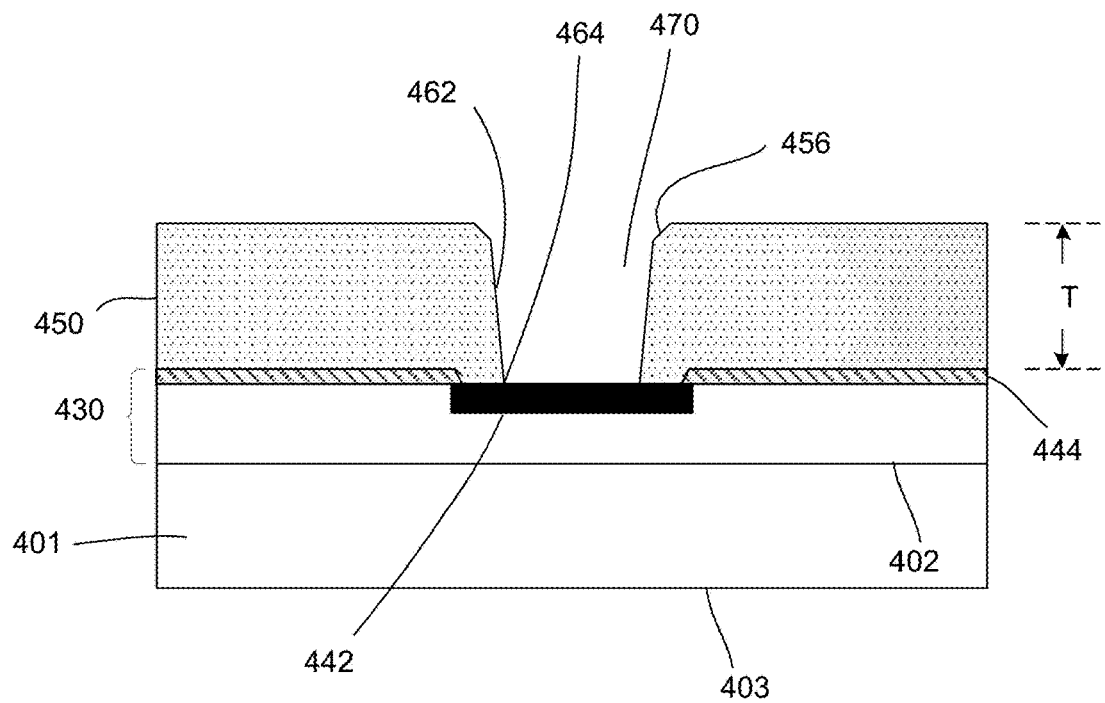

FIGS. 7a-7b show simplified cross-sectional views of a portion of a processed wafer 400 illustrating another embodiment of a process for forming via openings in the cover layer 450 on the processed wafer 400. The portion of the processed wafer 400 corresponds to one die bond pad 442. Of course, as discussed, it is understood that the processed wafer 300 includes numerous die bond pads 342 of numerous dies 310. The process and the processed wafer 400 with the cover layer 450 are similar to those described in FIG. 5 and FIGS. 6a-6c. Common elements may not be described or described in detail.

Referring to FIG. 7a, the first etch process forms a partial via opening 460 in the cover layer 450 on top of the BEOL dielectric stack 430. As shown, the top of the BEOL dielectric stack 430 includes a passivation layer 444 with a pad opening 448 to expose the die bond pad 442.

In one embodiment, the first etch process is a laser etch process using a pulsed ultra-violet (UV) laser ablation or drilling tool. The first etch process employs normal P and normal E to etch the cover layer 450 to form the partial via opening 460. The first etch process is controlled etch which etches the cover layer 450 to a depth (D). The depth (D) is less than a thickness (T) of the cover layer 450. The first etch process leaves a remaining portion of the cover layer 450 having the flat thickness (R) over the die bond pad 342.

In one embodiment, the partial via opening 460 may be circular. Other shaped partial via openings may also be formed. In one embodiment, the first etch process forms the partial via opening 460 with a slanted sidewall 462. The slanted sidewall 462 of the partial via opening 460 may be referred to as an upper via opening sidewall. A remaining cover layer over the die bond pad 442 forms a bottom surface of the partial via opening 460.

In FIG. 7b, the second etch process is performed. In one embodiment, the second etch process is a plasma etch. The plasma etch removes the remaining portion of the cover layer 450 to expose the die bond pad 442. For example, the second etch process completes forming via opening 470 which exposes die bond pad 442. In one embodiment, the second etch process forms the via opening 470 with a slanted sidewall. For example, the upper via opening sidewall 462 (formed by the first etch process) and a lower via opening sidewall 464 (formed by the second etch process) are slanted, tapering inwards from the top of the cover layer 450 to the bottom of the cover layer 450. In one embodiment, the upper via opening sidewall 462 is a laser-etched sidewall and the lower via opening sidewall 464 is a plasma-etched sidewall. By employing a plasma etch as the second etch process, damage to the die bond pad is avoided.

The plasma etch, in one embodiment, also removes the top surface of the cover layer 450 while it removes the remaining portion over the die bond pad 442. For example, the thickness (T) of the cover layer 450 is reduced as a result of the second etch. Since the remaining portion over the die bond pad has the flat thickness (R), the top surface of the cover layer 450 is also reduced by a thickness equal to R. As such, the initial thickness Ti of the cover layer 350 needs to take this loss due to the second etch process into account. For example, the thickness T of the cover layer 450 may be increased by R (T=Ti+R). In addition, the plasma etch also causes some erosion 356 at the top of the via opening 370. For example, the interface of the top surface of the cover layer 350 and upper via opening sidewall 362 may not be a sharp corner due to erosion.

In other embodiments, the top surface of the cover layer 450 is reduced by a thickness more than R during the plasma etch. For example, the top surface of the cover layer 450 is reduced by a thickness of 20% more than R during the plasma etch.

After forming the via opening 470 in the cover layer 450, the process may continue. For example, the process may continue until the processed wafer 400 is singulated into individual dies 410 and packaged to form packaged dies.

Figure 8A:
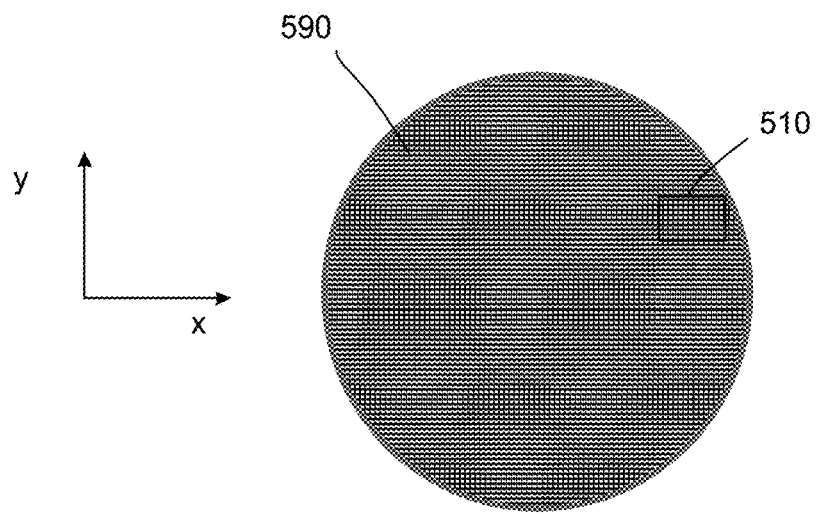
FIGS. 8a-8d illustrate another embodiment of a process for forming via openings in a cover layer formed on the top of the processed semiconductor wafer.
Figure 8A:
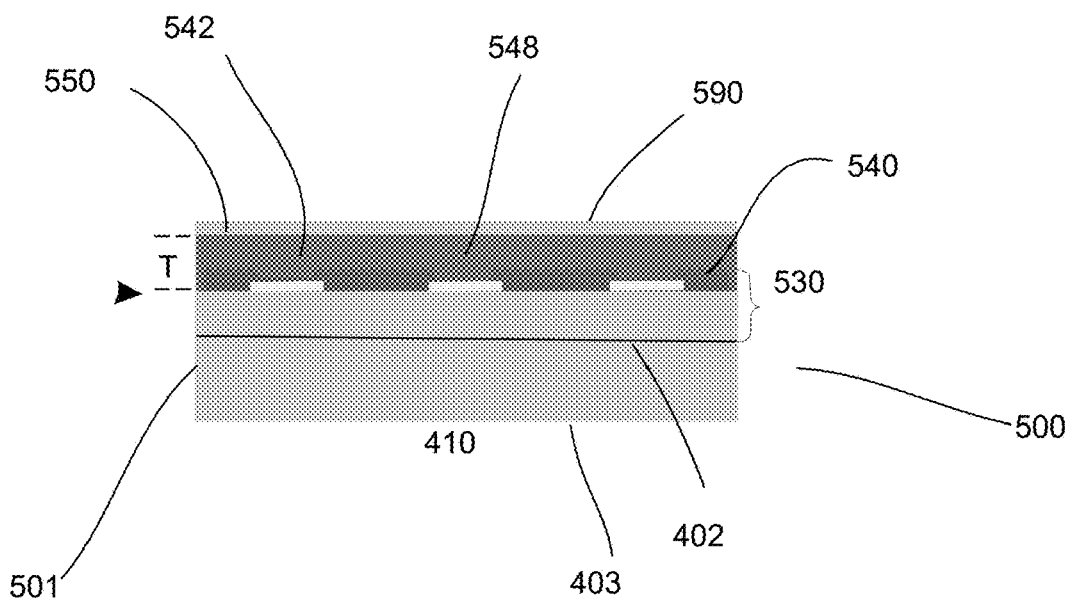
Figure 8B:
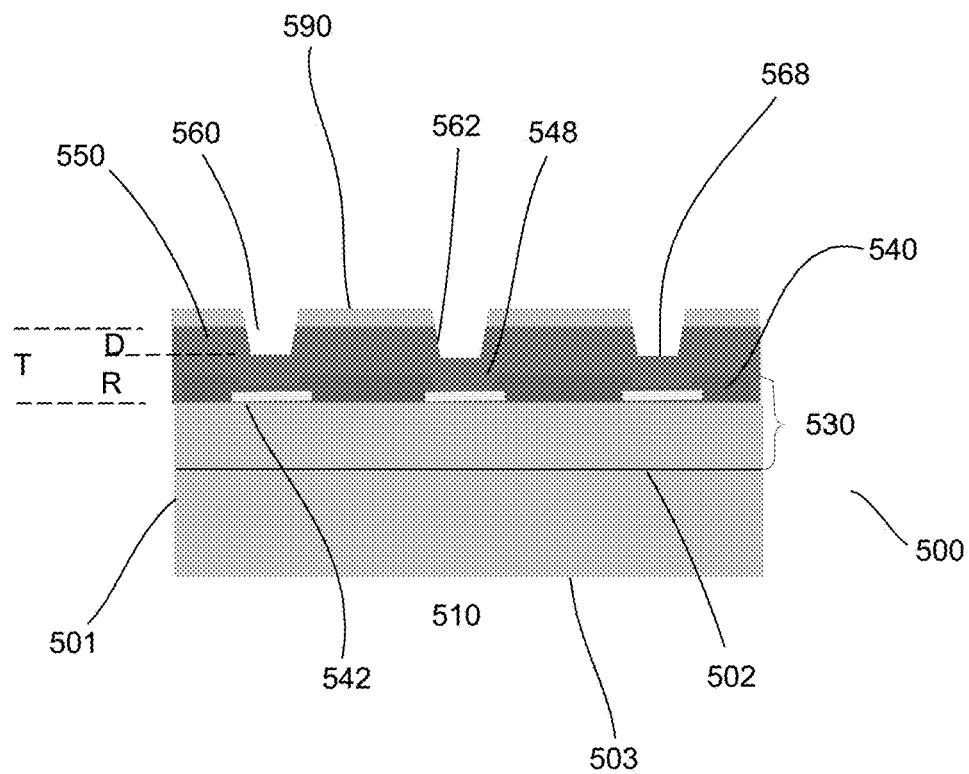
Figure 8C:
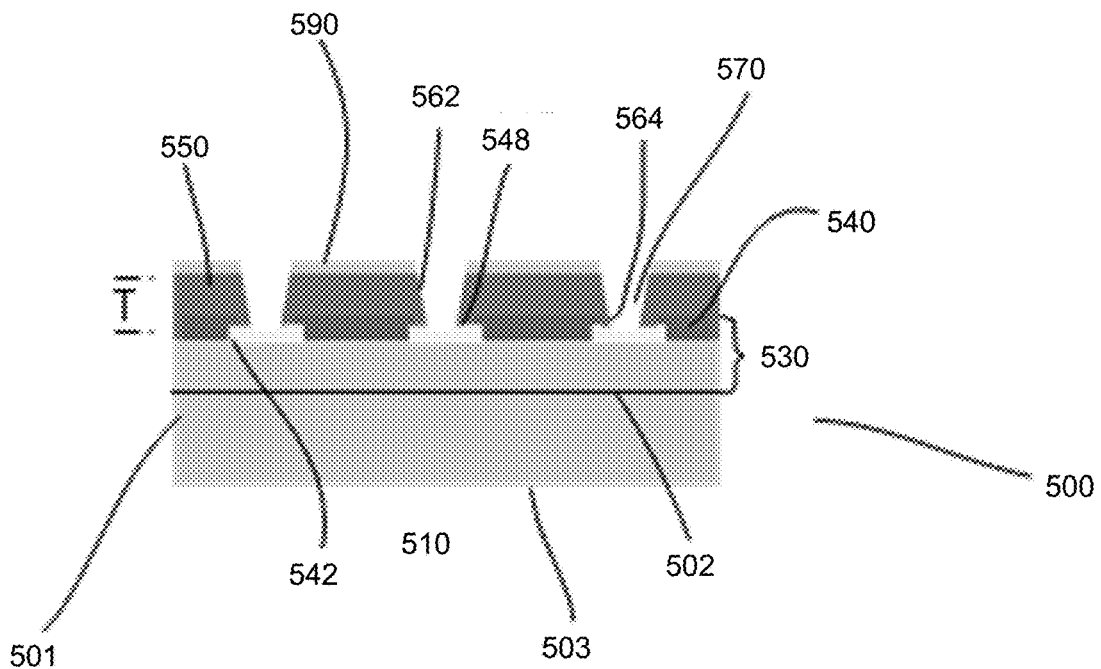
Figure 8D:
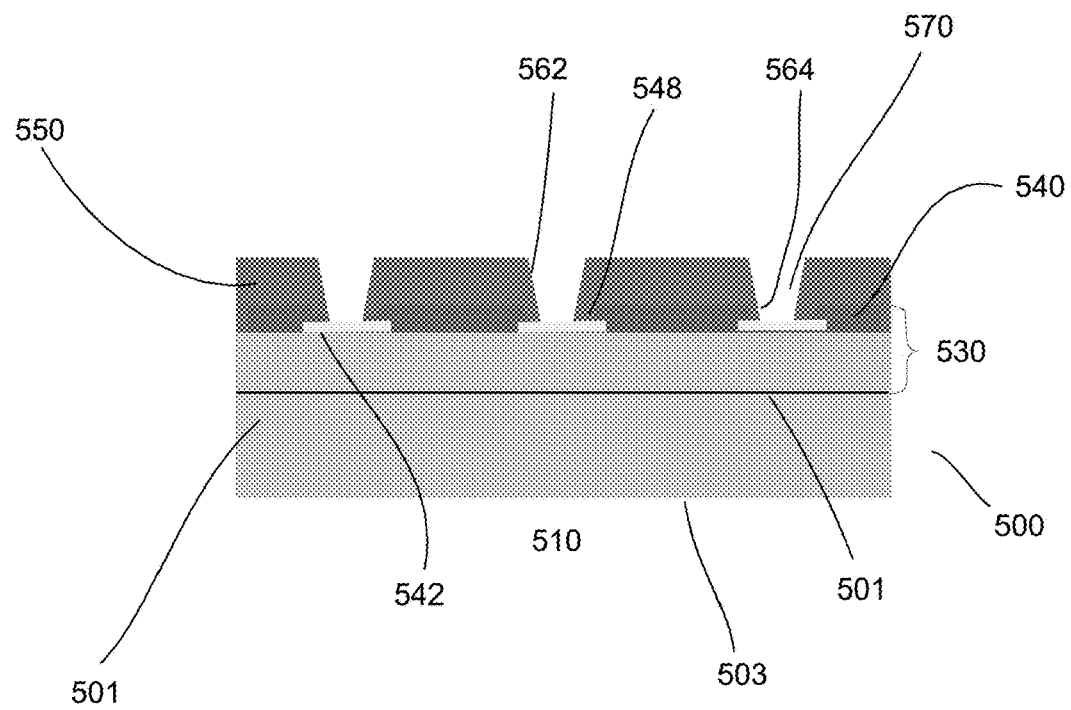

FIGS. 8a-8d show yet another embodiment of a process for forming via openings in a cover layer 550 on a processed wafer 500. In particular, FIG. 8a shows an image of a top view of the processed semiconductor wafer 500 with a mask layer 590 over the cover layer 550 and a simplified cross-sectional view of a portion of the processed semiconductor wafer 500 with the mask layer 590 over the cover layer 550 while FIGS. 8b-8d show simplified cross-sectional views of the portion of the processed semiconductor wafer 500 with the cover layer 550. The cross-sectional views, for example, correspond to a die 510 on the processed wafer 500. The process and the processed wafer 500 with the cover layer 550 are similar to those described in FIG. 5, FIGS. 6a-6c and FIGS. 7a-7b. Common elements may not be described or described in detail.

Referring to FIG. 8a, the processed semiconductor wafer 500, for example, includes circuit components (not shown) of the dies 510 formed on an active wafer surface 502 of the wafer 501. An opposing surface 503 may be an inactive wafer surface. The back-end-of-line (BEOL) dielectric stack 530 with interconnects (not shown) is formed on the active surface 502 of the wafer 501 with the circuit components. The top interconnect level of the BEOL dielectric stack 530 is the pad level with a passivation layer 540 with pad openings 548 for exposing die bond pads 542 for providing external connections to the circuit components.

The cover layer 550 is formed on the top of the BEOL stack 530, covering the passivation layer 540 with the pad openings 548 and the die bond pad 542. The cover layer 550, in one embodiment, is a dielectric cover layer. In one embodiment, the cover layer 550 is a composite cover layer with a base cover layer and fillers. Other types of dielectric cover layers may also be useful.

In one embodiment, the cover layer 550 is tailored to prevent cracking and chipping in the BEOL dielectric stack 530 during dicing. In one embodiment, the Young's Modulus and Breaking Strength is selected to reduce or prevent cracking and chipping during the wafer singulation process. The Young's Modulus of the cover layer 550 is about 10,000-25,000 MPa, about 14,000-25,000 MPa, about 15,000-25,000 MPa, about 16,000-25,000 MPa, about 15,000-20,000 MPa or about 20,000-25,000 MPa. As for the Breaking Strength of the cover layer 550, it may be about 45-150 MPa, about 70-150 MPa, about 70-120 MPa, about 70-105 MPa, about 80-120 MPa or about 90-100 MPa. In one embodiment, the coefficient of thermal expansion of the cover layer 550 is about 6-20 ppm/° C. The temperature stability of the cover layer 550 may be from −65-+300° C.

The cover layer 550 has a thickness (T). In one embodiment, T is about 10-100 um, 15-100 um, 20-100 um, 25-100 um, 45-100 um or 60-100 um. A thickness tolerance of the cover layer 550 may be ±1-5 um. Providing the cover layer 550 with other thicknesses may also be useful.

Various techniques may be used to form the cover layer 550. In one embodiment, the cover layer 550 is formed by compression molding or lamination, such as vacuum type or roller type lamination. Other techniques, such as spin-coating, slit die or printing, may also be useful. An adhesion-promoting layer (not shown) may be formed over the top of the BEOL dielectric stack 530 before forming the cover layer 550 to enhance the bonding force at the interface of the BEOL dielectric stack 530 and the subsequently formed cover layer 550.

In one embodiment, a mask layer 590 is formed over the cover layer 550. For example, the mask layer 590 is formed on top of the cover layer 550. The cover layer 550 is an etch mask for forming the via openings in the cover layer 550 to expose the bond pads 542. Various types of layers can be used to form the cover layer 550. For example, the mask layer 590 may be a metal mask layer or a non-metal mask layer. Furthermore, the mask layer 590 may be a single mask layer or a mask layer stack having multiple mask layers. In the case of the mask layer stack, it may include metal layers, non-metal layers or a combination thereof. Other arrangements of mask layers 590 may also be useful. In one embodiment, the mask layer 590 is formed of copper (Cu), titanium (Ti), nickel (Ni) alloys thereof, or a combination thereof.

Various techniques, such as sputtering, plating, laminating or a combination thereof may be employed to form the mask layer 590. Other techniques may also be employed to form the mask layer 590. The technique employed may, for example, depend on the type of mask layer formed. The thickness of the mask layer 590 may be about in a range of 0.3-1 um, 0.5-1 um, 0.7-1 um or 0.9-1 um. In one embodiment, the thickness of the mask layer 590 is about 0.6 um. Providing the mask layer with other thicknesses may also be useful.

In FIG. 8b, the first etch process forms partial via openings 560 in the mask layer 590 and cover layer 550. In one embodiment, the first etch process is a laser etch process using a pulsed ultra-violet (UV) laser ablation or drilling tool. The first etch process employs normal P and normal E to etch the mask layer 590 and cover layer 550 to form the partial via openings 560. The first etch process is controlled etch which etches the cover layer 550 to the depth (D). The depth (D) is less than the thickness (T) of the cover layer 550. The first etch process leaves a remaining portion of the cover layer 550 having a flat thickness (R) over the die bond pads 542. The partial via openings 560 extend through the mask layer 590 and a portion of the cover layer 550.

The partial via openings 560 may be circular. Other shaped openings may also be formed. In one embodiment, the first etch process forms the partial via openings 560 with slanted sidewalls 562. The slanted sidewalls 562 of the partial via openings 560 may be referred to as an upper via opening sidewall. The remaining cover layer over the die bond pad 542 forms the bottom surface of the partial via openings 560.

As shown in FIG. 8c, the second etch process is performed to remove the remaining portion of the cover layer 550 to expose the die bond pads 542. For example, the second etch process completes forming via openings 570 which exposes the die bond pads 542. In one embodiment, the second etch process is the plasma etch.

In one embodiment, the second etch process forms the via openings 570 with slanted sidewalls. For example, the upper via opening sidewalls 562 (formed by the first etch process) and lower via opening sidewalls 564 (formed by the second etch process) are slanted, tapering inwards from the top of the mask layer 590 to the bottom of the cover layer 550. In one embodiment, the upper via opening sidewalls 562 are laser-etched sidewalls and the lower via opening sidewalls 564 are plasma-etched sidewalls.

By employing the plasma etch for the second etch process, damage to the die bond pads 542 is avoided. Furthermore, the mask layer 590 protects the top surface of the cover layer 550 from being etched. This avoids the necessity to increase the initial thickness of the cover layer 550. In addition, the mask layer maintains the sharp corner interfaces between the top surface of the cover layer 550 and the upper via opening sidewalls 562 of the via openings 570.

Referring to FIG. 8d, the mask layer is removed, exposing the top surface of the cover layer 550. Various techniques may be employed to remove the mask layer 590. For example, the mask layer 590 may be removed by a mechanical process, a chemical process or a combination thereof. Other techniques for removing the mask layer 590 may also be useful.

After removing the mask layer 590, the process may continue. For example, the process may continue until the processed wafer 500 is singulated into individual dies 510 and packaged to form packaged dies.

Figure 9A:
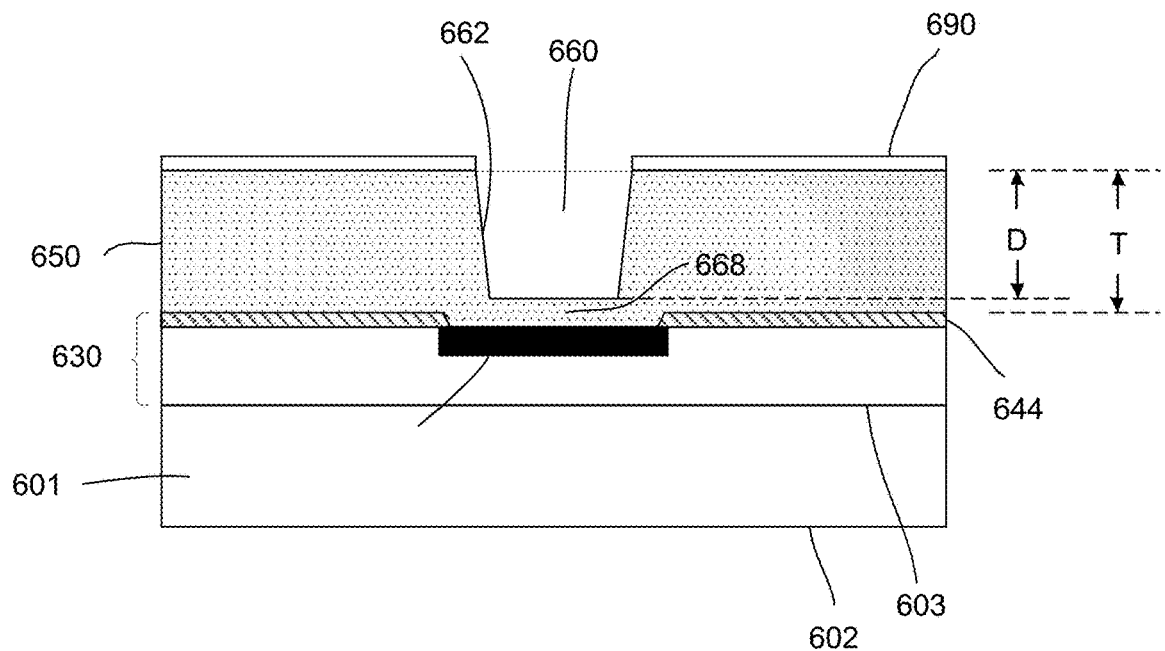
FIGS. 9a-9c illustrate simplified cross-sectional views of another embodiment of a process for forming vias in the cover layer on the top of the processed semiconductor wafer.
Figure 9B:
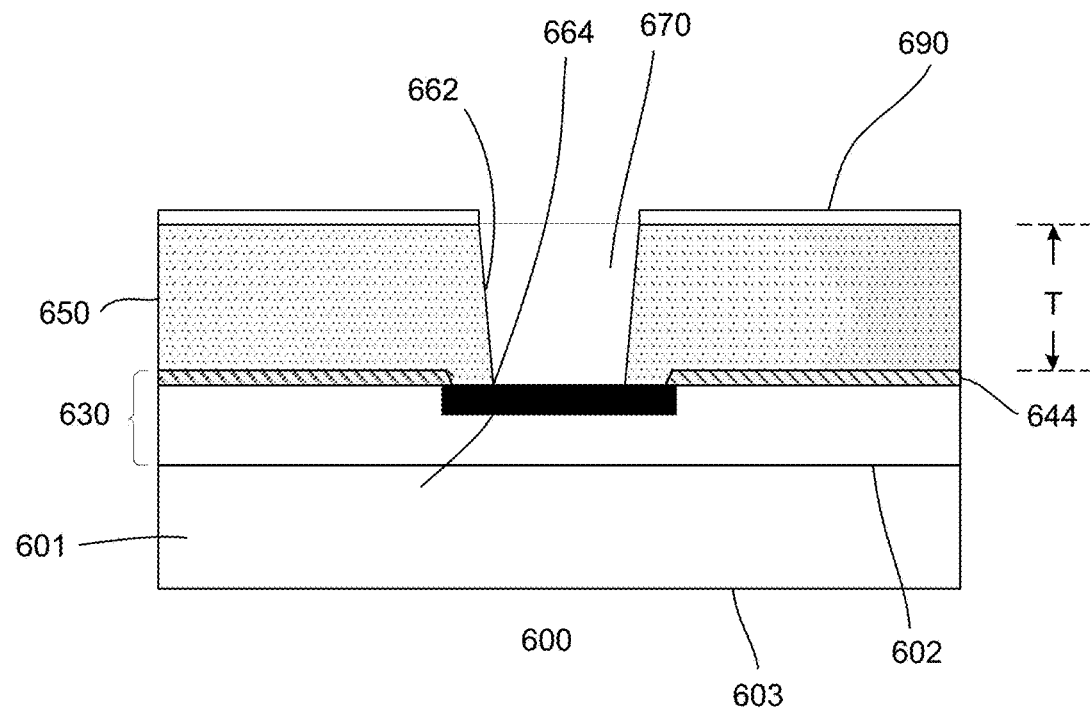
Figure 9C:
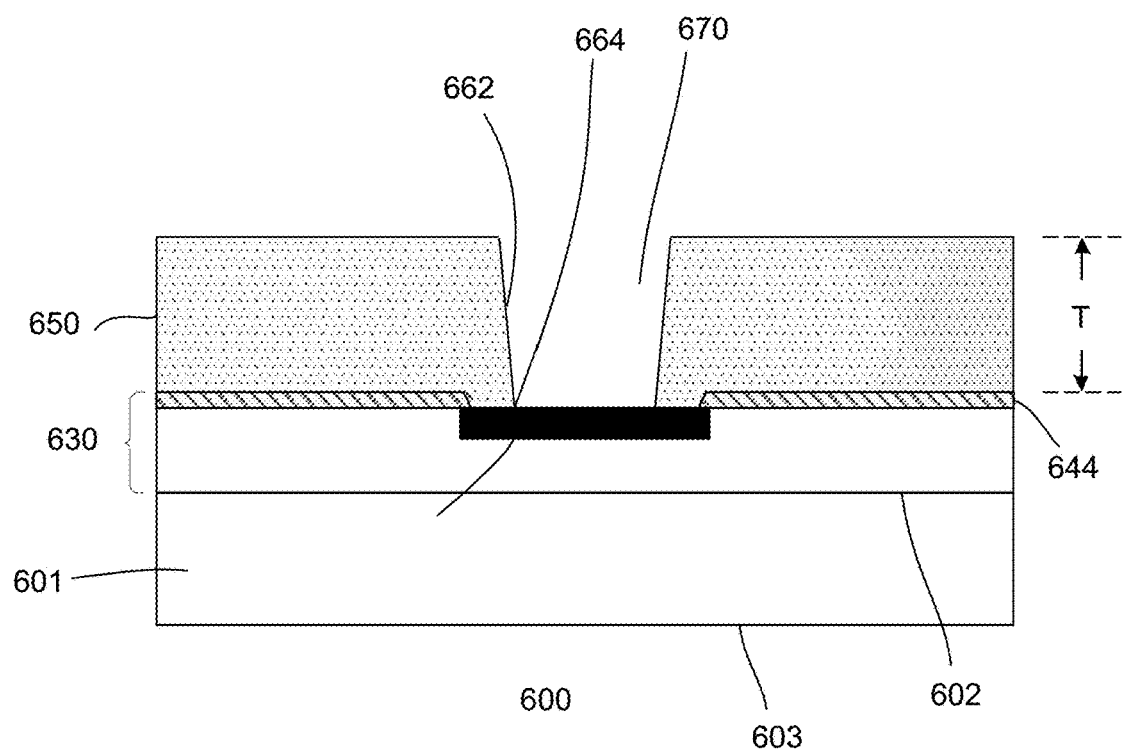

FIGS. 9a-9c show simplified cross-sectional views of a portion of a processed wafer 600 illustrating yet another embodiment of a process for forming via openings in a cover layer 650 on the processed wafer 600 using a mask layer 690. The portion of the processed wafer 600 corresponds to one die bond pad 642. Of course, as discussed, it is understood that the processed wafer 600 includes numerous die bond pads 642 of numerous dies 610. The process and the processed wafer 600 with the cover layer 650 are similar to those described in FIG. 5, FIGS. 6a-6c, FIGS. 7a-7b and FIGS. 8a-8d. Common elements may not be described or described in detail.

In FIG. 9a, the first etch process is performed on the processed wafer 600 with a mask layer 690 on the cover layer 650 which is on top of a BEOL dielectric stack 630 with a passivation layer 644 with pad openings and die bond pads 642. The first etch process forms a partial via opening 660 through the mask layer 690 and partially through the cover layer 650. In one embodiment, the first etch process is a laser etch process using a pulsed ultra-violet (UV) laser ablation or drilling tool. The first etch process employs normal P and normal E to etch the mask layer 690 and the cover layer 650 to form the partial via opening 660. The first etch process is controlled etch which etches the cover layer 650 to the depth (D). The depth (D) is less than the thickness (T) of the cover layer 650. The first etch process leaves a remaining portion of the cover layer 650 having the flat thickness (R) over the die bond pad 642.

In one embodiment, the partial via opening 660 may be circular. Other shaped partial via openings may also be formed. In one embodiment, the first etch process forms the partial via opening 660 with a slanted sidewall 662. The slanted sidewall 662 of the partial via opening 660 may be referred to as an upper via opening sidewall. The remaining cover layer over the die bond pad 642 forms the bottom surface of the partial via opening 660.

Referring to FIG. 9b, the second etch process is performed to remove the remaining portion of the cover layer 650 to expose the die bond pads 642. For example, the second etch process completes forming a via opening 670 which exposes the die bond pads 642. In one embodiment, the second etch process is the laser etch using low P and low E.

The mask layer, as shown in FIG. 9c, is removed. Removing the mask layer 690 exposes the top surface of the cover layer 650. Various techniques may be employed to remove the mask layer 690. For example, the mask layer 690 may be removed by a mechanical process, a chemical process or a combination thereof. Other techniques for removing the mask layer may also be useful.

After removing the mask layer, the process may continue. For example, the process may continue until the processed wafer 600 is singulated into individual dies 610 and packaged to form packaged dies.

Figure 10:
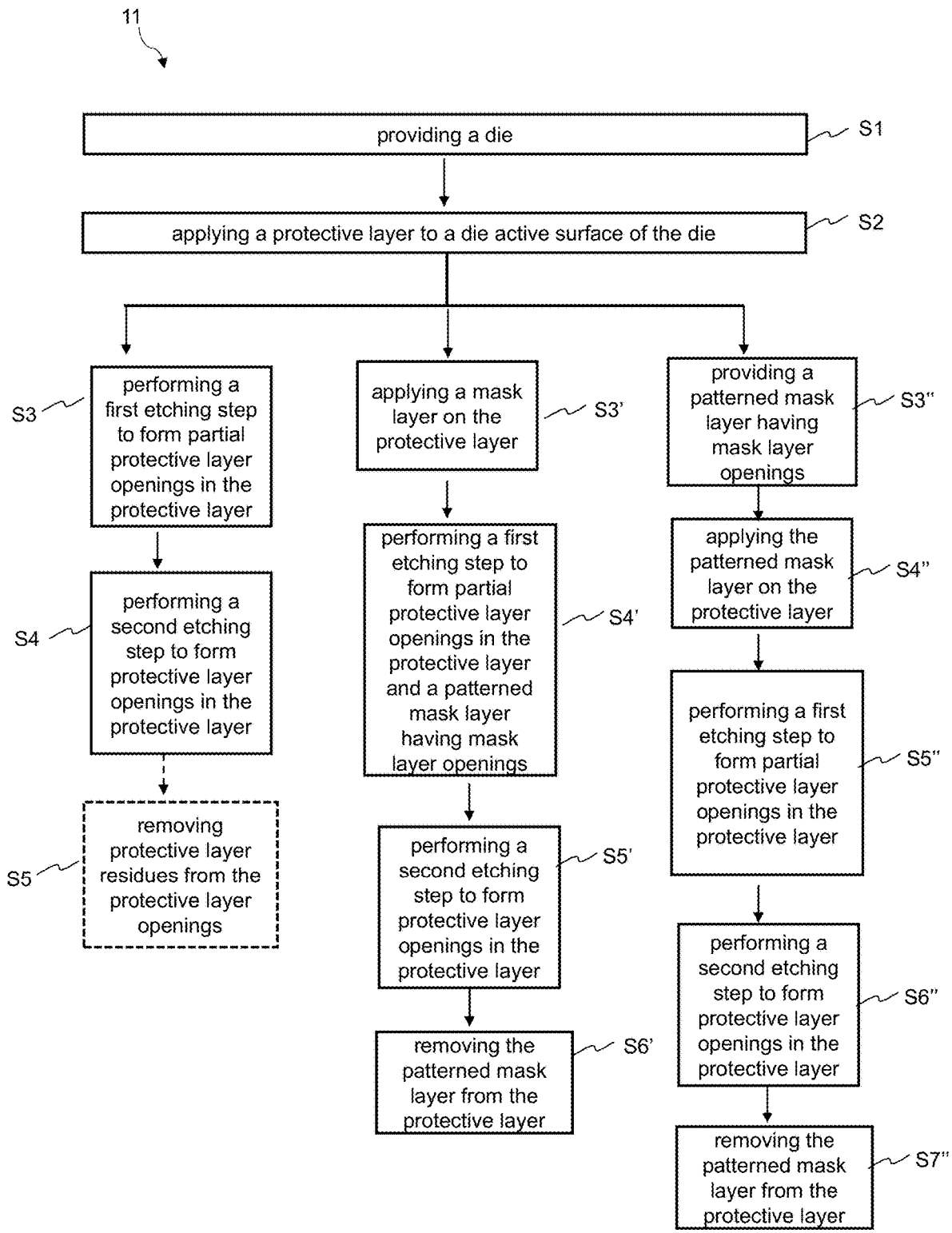
FIG. 10 illustrates a flow chart of another two-step etching process to a die according to an exemplary embodiment of the present disclosure.

FIG. 10 shows a flow chart of another two-step etching process 11 according to an exemplary embodiment of the present disclosure. FIG. 11 to FIG. 13 illustrates schematic diagrams of making the die structure 152 with the two-step etching process 11 by following the flow chart in FIG. 10.

The two-step etching process 11 is similar to the two-step etching process 10 except that the dies 113 are provided in the Step S1, such as by singulating the wafer 100 into the dies 113; while the following Steps S3 to S5, S3' to S6' and S3" to S7" of the two-step etching process 11 are performed similarly to the two-step etching process 10. Accordingly, the same reference numerals are also used herein for describing the same or similar features as described in the two-step etching process 10.

FIG. 11a-11d illustrate schematic diagrams of making the die structure 152 using the two-step etching process 11 in FIG. 10.

Figure 11A:
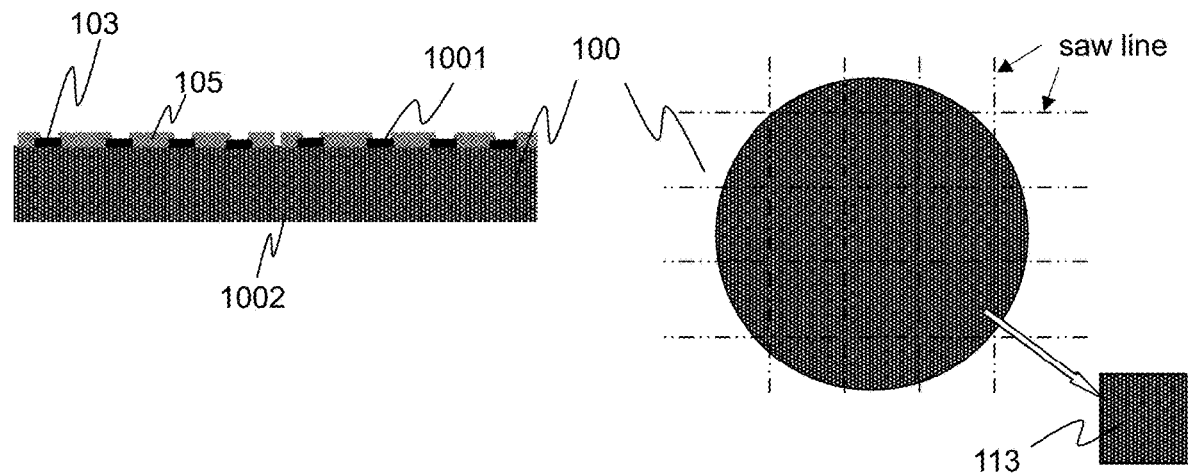
FIG. 11a-11d illustrate schematic diagrams of making a die structure using the two-step etching process in FIG. 10 according to an exemplary embodiment of the present disclosure.

Step S1: providing the die 113. Referring to FIG. 11a, the wafer 100 having the wafer active surface 1001 and the wafer inactive surface (also known as wafer back surface) 1002 are singulated along the saw lines into the dies 113. The die 113 has the die active surface 1131 and the die back surface 1132. In addition, the die 113 has one or more contact pads (such as two contact pads shown in FIG. 11a) 103 at the die active surface 1131 for leading out the electrical connections. The dies 113 may be picked and placed onto a panel (not shown) for facilitating further panel-level processes.

Figure 11B:
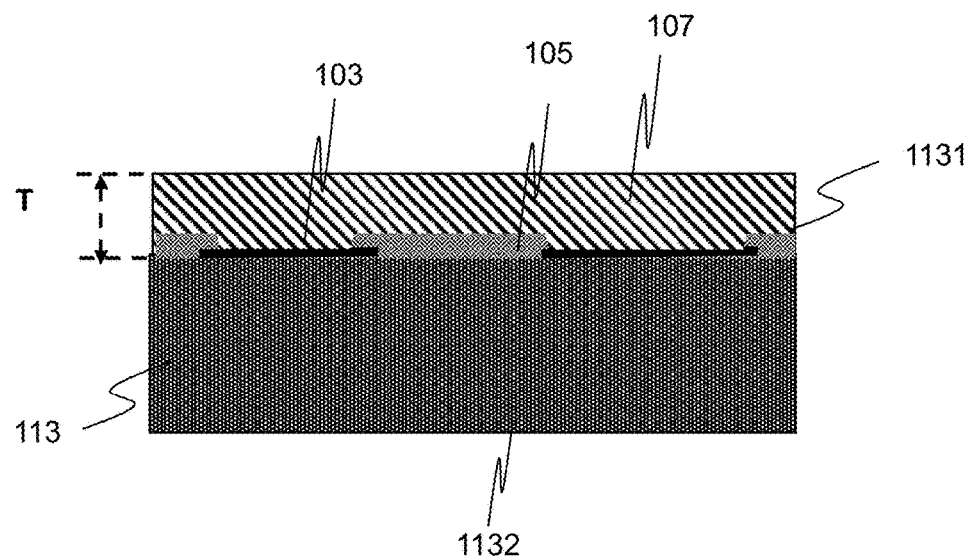

Step S2: applying the protective layer 107 to the die active surface 1131 of the die 113. Referring to FIG. 11b. The protective layer 107 with the flat thickness (T) is applied onto the die active surface 1131 and covers the contact pads 103. While the protective layer 107 may not have the varied thickness (T') as described in FIG. 2c, due to small sizes of the dies 113. Therefore, the two-step etching process 11 advantageously has simpler and better control of the protective layer 107, compared with the two-step etching process 10 in a wafer-level.

The adhesion promoting layer 101 (not shown) may be also applied between the die active surface 1131 and the protective layer 107 after the singulation. Alternatively, the adhesion promoting layer 101 may be applied onto the wafer active surface 1001 before the singulation in FIG. 11a, and then sawed together with the wafer 100 to form the dies 113 with the adhesion promoting layer 101.

Figure 11C:
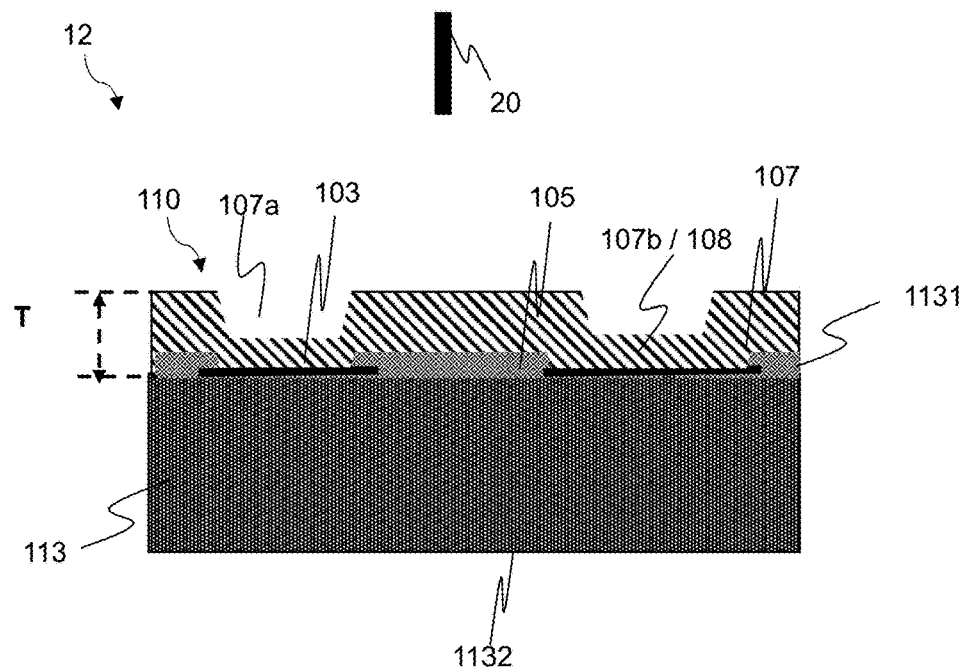
Figure 11D:
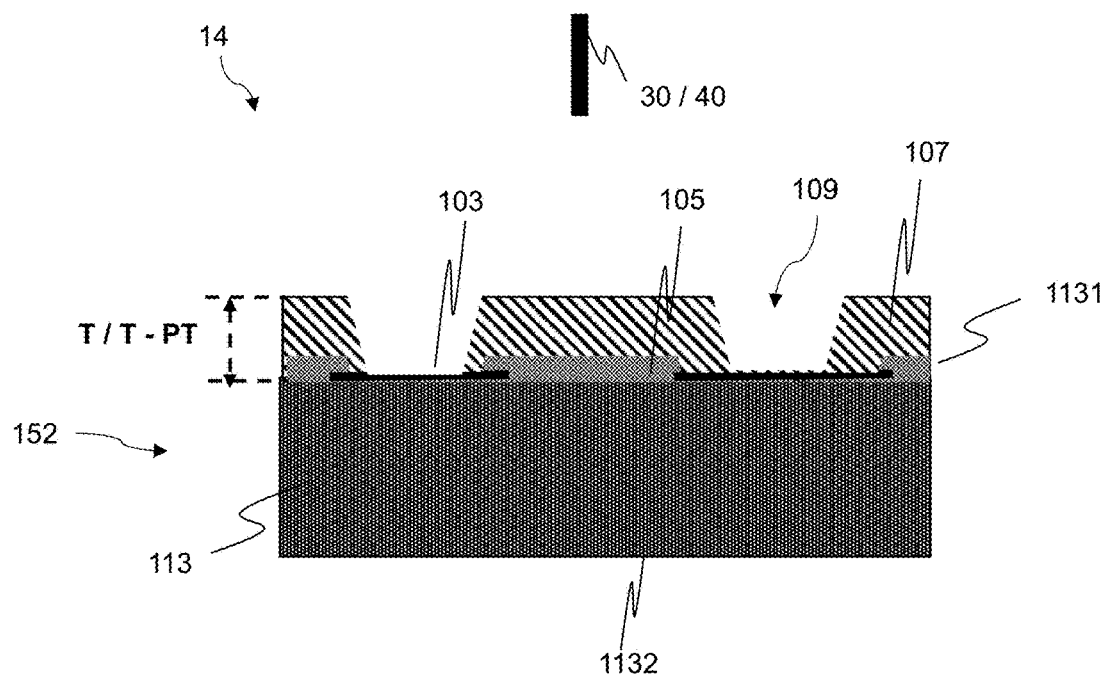

Steps S3 to S5 are performed similarly as described above, except that the two-step etching process 10 is performed in the wafer-level; while the two-step etching process 11 is performed in a die-level or a panel-level (if placed on the panel). Referring to FIG. 11c, the first etching step 12 is performed with the high-power laser etching device 20 for partially removing the top portion 107a of the protective layer 107 corresponding to the contact pads 103 and forming the partial protective layer openings 110 in the protective layer 107. The remaining protective layer 108 is left in the partial protective layer openings 110 and still covers the contact pads 103. Referring to FIG. 11d, the second etching step 14 is then performed with the low-power laser etching device 30 or the plasma etching device 40 for removing the remaining protective layer 108 and forming the protective layer openings 109 to expose the contact pads 103 from the protective layer 107. In particular, the contact pads 103 are not damaged in the second etching process step 14. If the low-power laser etching device 30 is adopted, the additional step S5 may be needed to remove the protective layer residues 112 in the protective layer opening 109, similar to FIG. 2i.

FIG. 12a-12d illustrate schematic diagrams of making the die structure 152 using the two-step etching process 11 in FIG. 10.

Figure 12A:
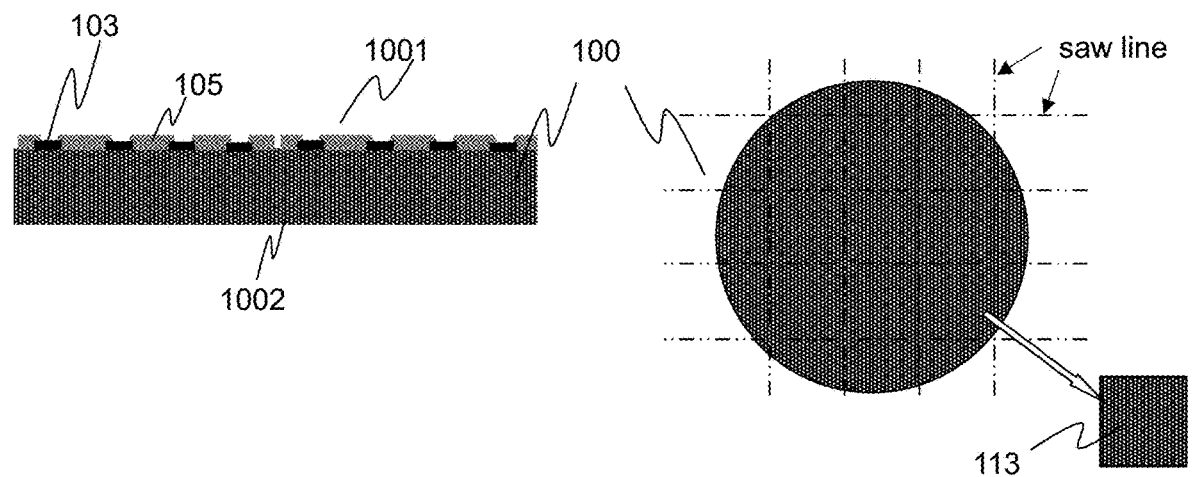
FIG. 12a-12d illustrate schematic diagrams of making the die structure using the two-step etching process in FIG. 10 with the mask layer according to another exemplary embodiment of the present disclosure.
Figure 12B:
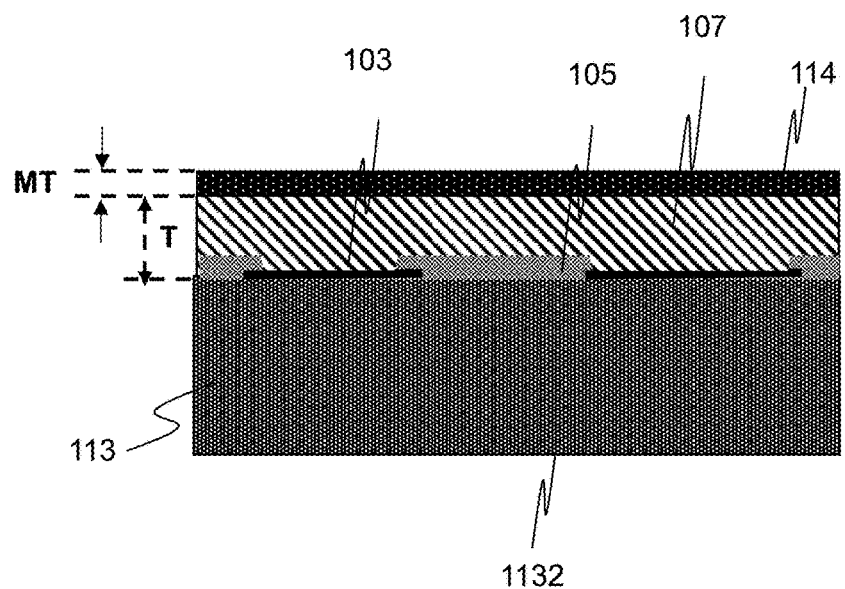

Steps S1 and S2 are conducted in the same manner shown in FIG. 12a and FIG. 12b; while Steps S3' to S6' are performed similarly to the description in the two-step etching process 10, except that the two-step etching process 11 is performed in the die-level or the panel-level.

Figure 12C:
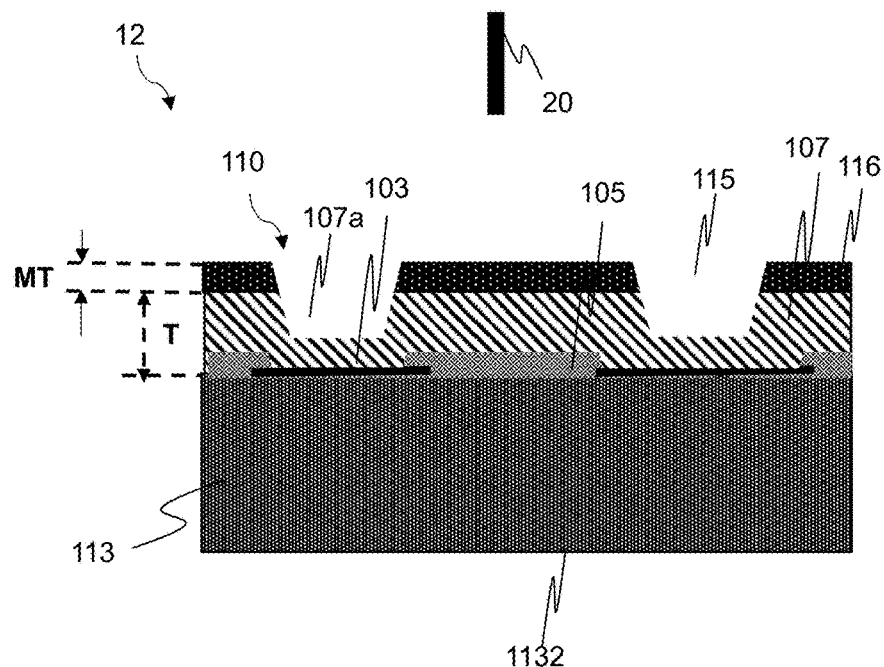
Figure 12D:
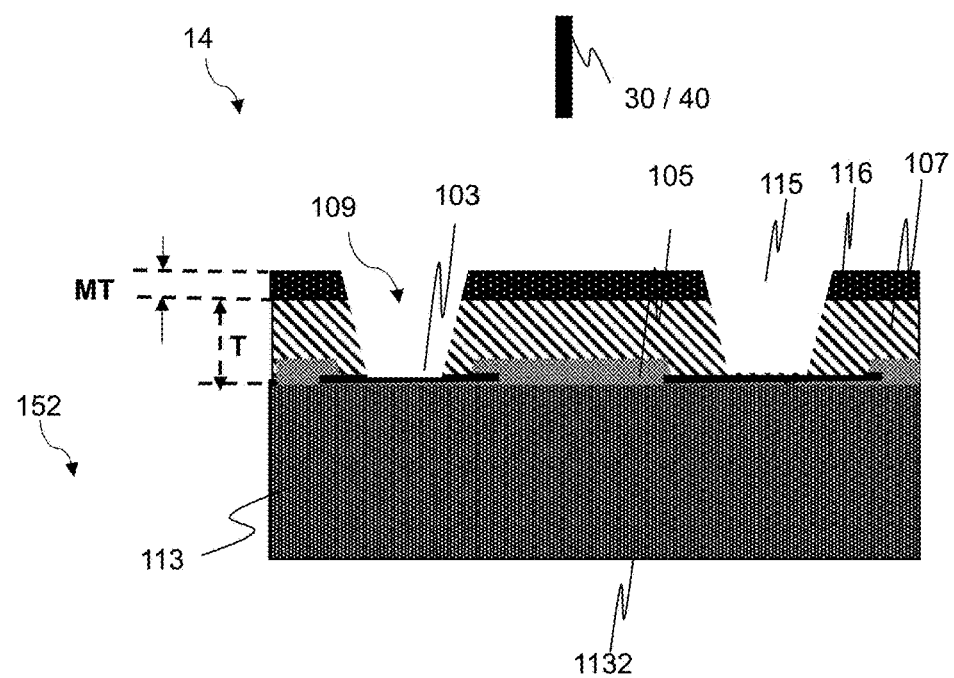

Referring to FIG. 12b, the mask layer 114 with the thickness (MT) is applied onto the protective layer 107, similar to FIG. 3c. Referring to FIG. 12c, the first etching step 12 is performed with the high-power laser etching device 20 for forming the partial protective layer openings 110 in the protective layer 107, as well as etching the mask layer 114 into the patterned mask layer 116 with the mask layer openings 115. Referring to FIG. 12d, the second etching step 14 is then performed with the low-power laser etching device 30 or the plasma etching device 40 for removing the remaining protective layer 108 and forming the protective layer openings 109 to expose the contact pads 103 from the protective layer 107. In particular, the contact pads 103 are not damaged in the second etching process step 14. If the low-power laser etching device 30 is adopted, the additional step S5 may be needed to remove the protective layer residues 112 in the protective layer opening 109, similar to FIG. 2i.

FIG. 13a-13d illustrate schematic diagrams of making the die structure 152 using the two-step etching process 11 in FIG. 10.

Steps S1 and S2 are conducted in the same manner shown in FIG. 12a and FIG. 12b; while Steps S3' to S6' are performed similarly to the description in the two-step etching process 10, except that the two-step etching process 11 is performed in the die-level or the panel-level.

Figure 13A:
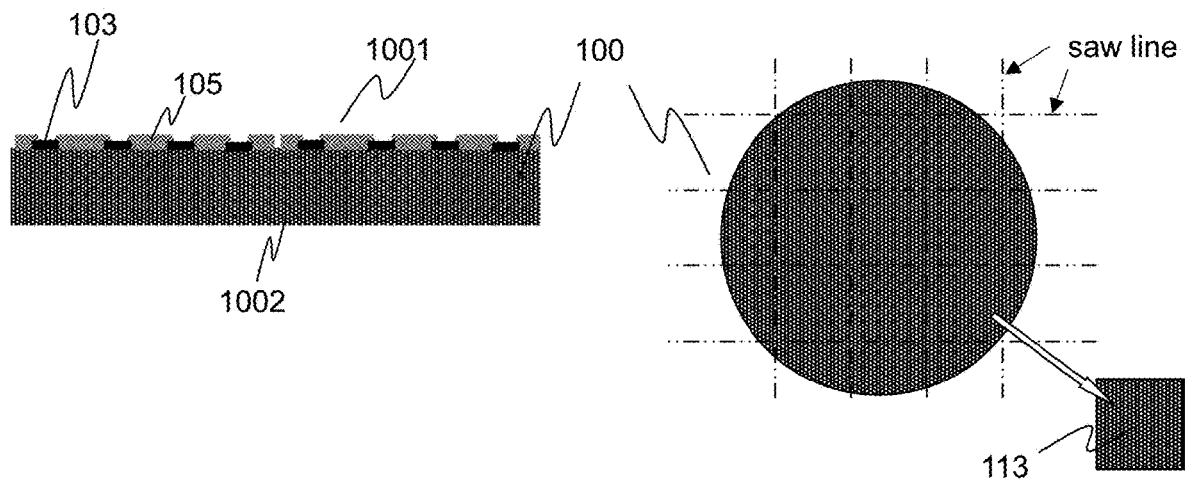
FIG. 13a-13d illustrate schematic diagrams of making the die structure using the two-step etching process in FIG. 10 the patterned mask layer according to another exemplary embodiment of the present disclosure.
Figure 13B:
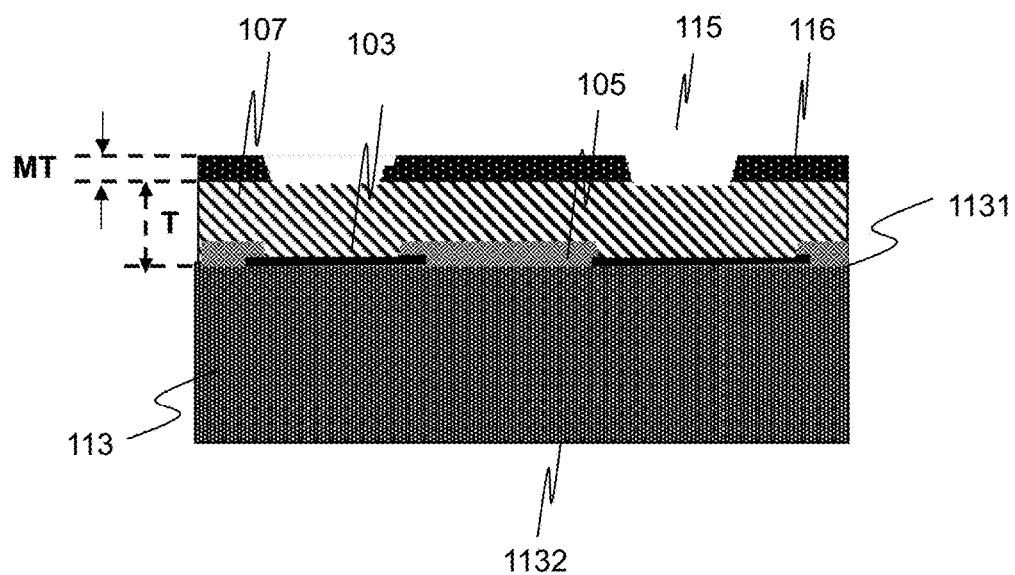
Figure 13C:
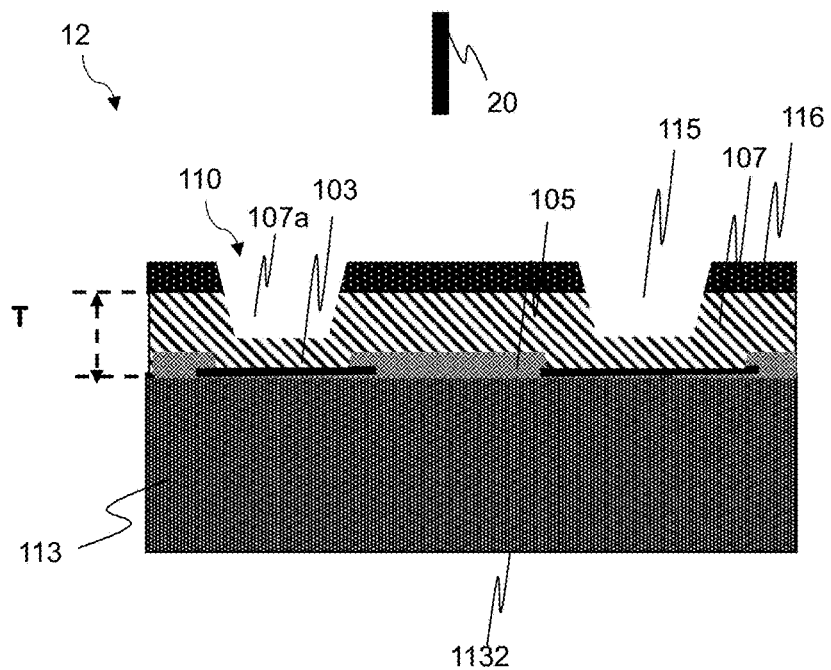
Figure 13D:
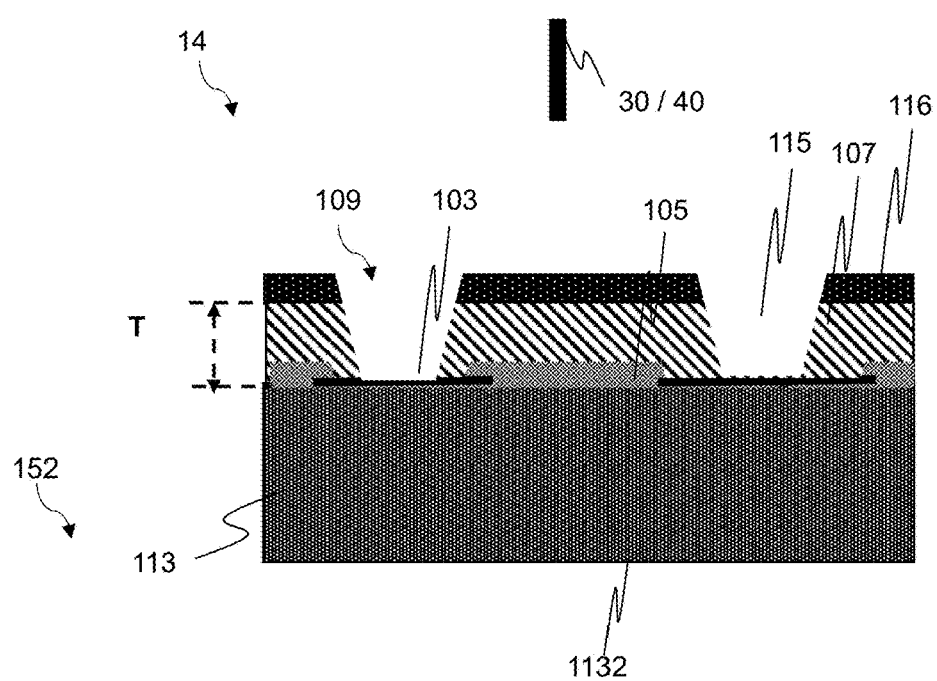

Referring to FIG. 13b, the patterned mask layer 116 with the thickness (MT) is applied onto the protective layer 107, similar to FIG. 4d. Referring to FIG. 13c, the first etching step 12 is performed with the high-power laser etching device 20 for forming the partial protective layer openings 110 in the protective layer 107, through the mask layer openings 115 of the patterned mask layer 116. Referring to FIG. 13d, the second etching step 14 is then performed with the low-power laser etching device 30 or the plasma etching device 40 for removing the remaining protective layer 108 and forming the protective layer openings 109 to expose the contact pads 103 from the protective layer 107. In particular, the contact pads 103 are not damaged in the second etching process step 14. If the low-power laser etching device 30 is adopted, the additional step S5 may be needed to remove the protective layer residues 112 in the protective layer opening 109, similar to FIG. 2i.

The two-step etching process 10 and the two-step etching process 11 have their respective advantages. The two-step etching process 10 performed in the wafer-level can process a plurality of the dies 113 simultaneously and thus advantageously enhance productivity for producing the die structure 152; while the two-step etching process 11 performed to the individual dies 113 has better control in the Step S2 for applying the protective layer 107 more uniformly across the die active surface 1131. In addition, the two-step etching process 11 may be performed to multiple dies 113 simultaneously in the panel-level by placing multiple dies 113 on the panel and thus also advantageously enhance productivity for producing the die structure 152.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

The invention claimed is:

1. A semiconductor structure, comprising:
   a semiconductor wafer with a wafer active surface, wherein a plurality of contact pads are formed on the wafer active surface;
   an insulating layer disposed on the wafer active surface to cover the wafer active surface and the contact pads;
   a mask layer disposed on the insulating layer, wherein a plurality of mask layer openings are formed in the mask layer in a multi-step etching process to expose top portions of the insulating layer corresponding to the contact pads from the mask layer; and
   a plurality of via openings configured to expose the contact pads, the via openings being formed in the insulating layer by removing the top portions of the insulating layer from the mask layer openings corresponding to the contact pads in the multi-step etching process, wherein forming the via openings comprises forming partial via opening before a final etching step of the multi-step etching process by leaving a remaining insulating layer in the via openings.

2. The semiconductor structure of claim 1, further comprising:
an adhesion promoting layer disposed between the wafer active surface and the insulating layer for adhering the insulating layer to the wafer active surface.

3. The semiconductor structure of claim 1, wherein the insulating layer not exposed from the mask layer openings forms sharp edges in relation to the via openings.

4. The semiconductor structure of claim 1, wherein the insulating layer comprises a composite layer with an organic base and inorganic fillers, wherein the inorganic fillers have a concentration in a range of 70 to 90 weight percent (wt %) of the composite layer.

5. The semiconductor structure of claim 1, wherein the insulating layer is configured with Young's Modulus and Breaking Strength to prevent cracking and chipping of the semiconductor wafer during a singulation process.

6. A method for making a semiconductor structure of claim 1, comprising:
providing a semiconductor wafer having a wafer active surface, wherein a plurality of contact pads are formed on the wafer active surface;
disposing an insulating layer on the wafer active surface to cover the wafer active surface and the contact pads;
disposing a mask layer on the insulating layer to completely cover the insulating layer; and
forming via openings in the insulating layer to expose the contact pads from the insulating layer by
forming a plurality of mask layer openings in the mask layer in a multi-step etching process to expose top portions of the insulating layer corresponding to the contact pads from the mask layer; and
removing the top portions of the insulating layer from the mask layer openings corresponding to the contact pads in the multi-step etching process, wherein forming the via openings comprises forming partial via opening before a final etching step of the multi-step etching process by leaving a remaining insulating layer in the via openings.

7. The method of claim 6, further comprising:
forming an adhesion promoting layer between the wafer active surface and the insulating layer for adhering the insulating layer to the wafer active surface.

8. The method of claim 6, further comprising:
performing a final etching step for removing the remaining insulating layer in the partial via opening to expose the contact pads from the insulating layer.

9. The method of claim 8, wherein at least one etching step and the final etching step are performed using a high-power laser etching process and a low-power laser etching process, respectively.

10. The method of claim 6, further comprising:
removing residues of the remaining insulating layer in the via openings by a plasma process after the final etching step.

11. The method of claim 6, wherein
at least one etching step and the final etching step are performed using a high-power laser etching process and a plasma etching process, respectively.

12. The method of claim 6, further comprising:
removing the mask layer from the insulating layer after the final etching step.

13. The method of claim 6, further comprising:
singulating the semiconductor wafer into a plurality of individual semiconductor dies, wherein the insulating layer remains on each individual semiconductor die with at least one of the via openings in the insulating layer.

14. A semiconductor structure, comprising:
a semiconductor wafer with a wafer active surface, wherein a plurality of contact pads are formed on the wafer active surface;
an insulating layer disposed on the wafer active surface to cover the wafer active surface and the contact pads; and
a plurality of via openings configured to expose the contact pads, the via openings being formed in the insulating layer by removing top portions of the insulating layer corresponding to the contact pads in a multi-step etching process, wherein forming the via openings comprises forming partial via opening before a final etching step of the multi-step etching process by leaving a remaining insulating layer in the via openings, wherein the partial via opening is formed using a high-power laser etching process.

15. The semiconductor structure of claim 14, wherein the final etching step is performed using a low-power laser etching process to remove the remaining insulating layer.

16. The semiconductor structure of claim 15, wherein residues of the remaining insulating layer are removed by a plasma process after the final etching step to expose the contact pads from the via openings.

17. The semiconductor structure of claim 14, wherein the final etching step is performed using a plasma etching process to remove the remaining insulating layer.

* * * * *